(12) United States Patent
Frolov et al.

(10) Patent No.: US 10,756,226 B2
(45) Date of Patent: Aug. 25, 2020

(54) PHOTOVOLTAIC DEVICE HAVING A STRETCHABLE CARRIER

(71) Applicant: SUNLIGHT AEROSPACE INC., Edison, NJ (US)

(72) Inventors: Sergey V. Frolov, New Providence, NJ (US); Michael Cyrus, Castle Rock, CO (US); Allan J. Bruce, Scotch Plains, NJ (US)

(73) Assignee: SUNLIGHT AEROSPACE INC., Edison, NJ (US)

( * ) Notice: Subject to any disclaimer, the term of this patent is extended or adjusted under 35 U.S.C. 154(b) by 279 days.

(21) Appl. No.: 14/602,560

(22) Filed: Jan. 22, 2015

(65) Prior Publication Data
US 2015/0311365 A1    Oct. 29, 2015

Related U.S. Application Data

(63) Continuation of application No. 12/381,588, filed on Mar. 13, 2009, now Pat. No. 9,012,763.

(51) Int. Cl.
*H01L 31/05* (2014.01)
*H01L 31/042* (2014.01)
(Continued)

(52) U.S. Cl.
CPC ........ *H01L 31/0508* (2013.01); *H01L 25/043* (2013.01); *H01L 31/0392* (2013.01);
(Continued)

(58) Field of Classification Search
CPC ............... H01L 31/042; H01L 31/0392; H01L 31/03529; H01L 31/03928; H01L 31/0508;
(Continued)

(56) References Cited

U.S. PATENT DOCUMENTS 2,986,169 A * 5/1961 McCormick ........... B29D 23/18
138/109
3,232,795 A * 2/1966 Snyder .................... F24J 2/5235
136/246
(Continued)

OTHER PUBLICATIONS

Overview of Solar Cells (Photovoltaic Cells), "Photovoltaic Cells (Solar Cells), How They Work", Downloaded from web site http://www.specmat.com/Overview%20of%20Solar%20Cells.htm on Jan. 20, 2009, pp. 1-3.
(Continued)

*Primary Examiner* — Tamir Ayad
(74) *Attorney, Agent, or Firm* — Moser Taboada; Alan Taboada

(57) ABSTRACT

A stretchable photovoltaic device, a stretchable photovoltaic module and a carrier for facilitating formation of a stretchable photovoltaic device and/or module are provided. The stretchable photovoltaic device includes a stretchable part, at least one photovoltaic cell and a surface over which that at least one photovoltaic cell is disposed. The stretchable part has a given length that is operable to change in response to a force being applied to the device. The given length may, for example, elongate when the force causes the device to elongate. Alternative and/or additionally, the given length may compress when the force causes the device to compress.

2 Claims, 19 Drawing Sheets

(51) Int. Cl.
    *H01L 31/0392* (2006.01)
    *H01L 31/0352* (2006.01)
    *H01L 25/04* (2014.01)
    *H01L 31/048* (2014.01)

(52) U.S. Cl.
    CPC .. *H01L 31/03529* (2013.01); *H01L 31/03925* (2013.01); *H01L 31/03926* (2013.01); *H01L 31/03928* (2013.01); *H01L 31/042* (2013.01); *H01L 31/048* (2013.01); *H01L 2924/0002* (2013.01); *Y02E 10/541* (2013.01); *Y02P 70/521* (2015.11)

(58) Field of Classification Search
    CPC ............. H01L 31/03926; H01L 31/048; H01L 25/043; H01L 2924/0002; Y02P 70/521; Y02E 10/541
    USPC .......................... 136/244, 251, 252, 259, 245
    See application file for complete search history.

(56) References Cited

U.S. PATENT DOCUMENTS

| | | | |
|---|---|---|---|
| 5,518,801 A | 5/1996 | Chappell et al. | |
| 6,288,326 B1* | 9/2001 | Hayashi | B32B 17/10009 136/244 |
| 8,389,862 B2* | 3/2013 | Arora | H01L 23/528 174/254 |
| 2006/0174930 A1* | 8/2006 | Murphy | B64G 1/443 136/246 |
| 2009/0205270 A1* | 8/2009 | Shaw | H02S 20/23 52/173.3 |

OTHER PUBLICATIONS

Izu, M., "Continuous Roll-to-Roll a-Si Photovoltaic Manufacturing Technology", Final Subcontract Report Apr. 1, 1992-Sep. 30, 1995, National Renewable Energy Laboratory, Feb. 1996, pp. 1-89.
"Cadmium telluride" from Wikipedia, the free encyclopedia,. Downloaded from web site http://en.wikipedia.org/wiki/Cadmium_telluride on Jan. 20, 2009, pp. 1-3.
Zweibel, Ken et al., "Cadmium Facts and Handy Comparisons", pp. 1-8.
"Microelectromechanical systems" from Wikipedia, the free encyclopedia. Downloaded from web site http://en.wikipedia.org/wiki/MEMS on Jan. 20, 2009, pp. 1-7.

* cited by examiner

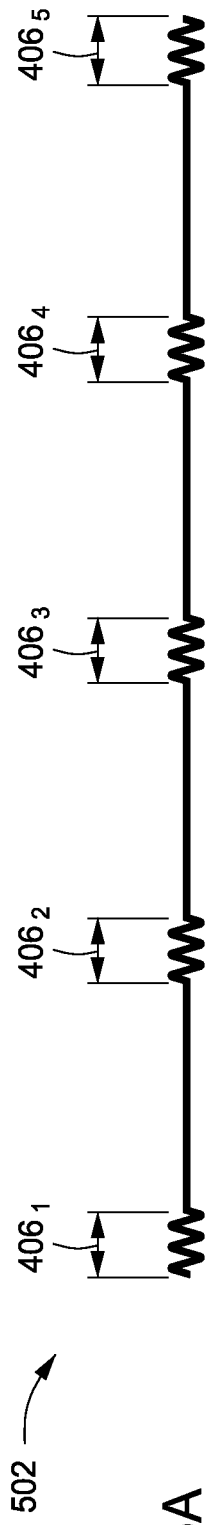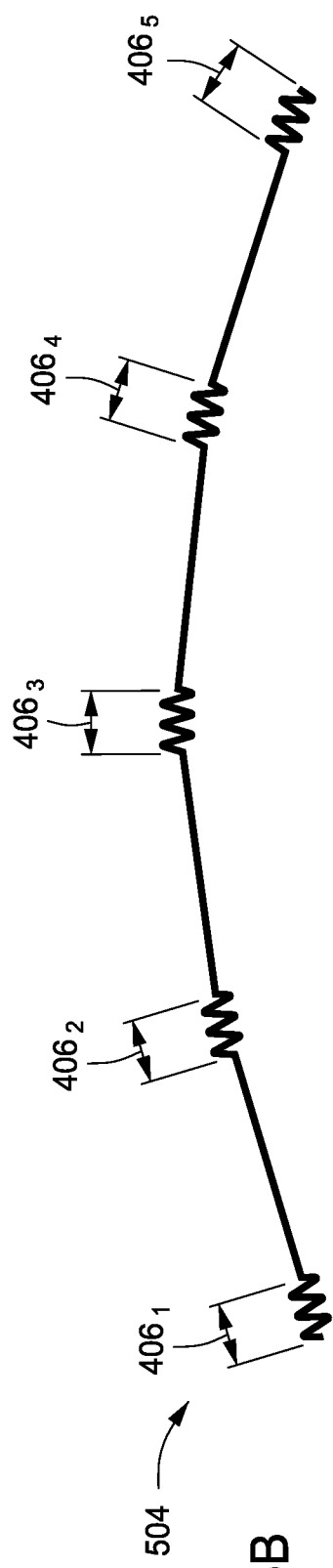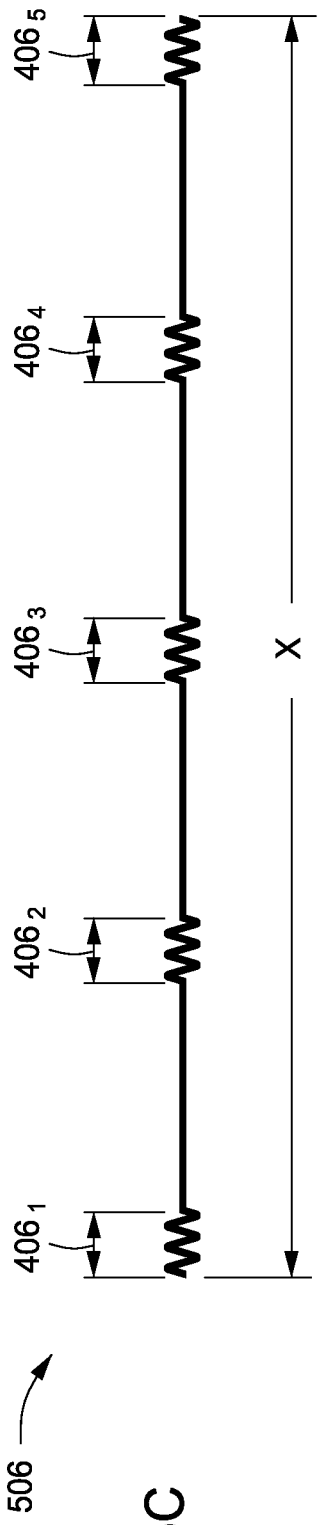

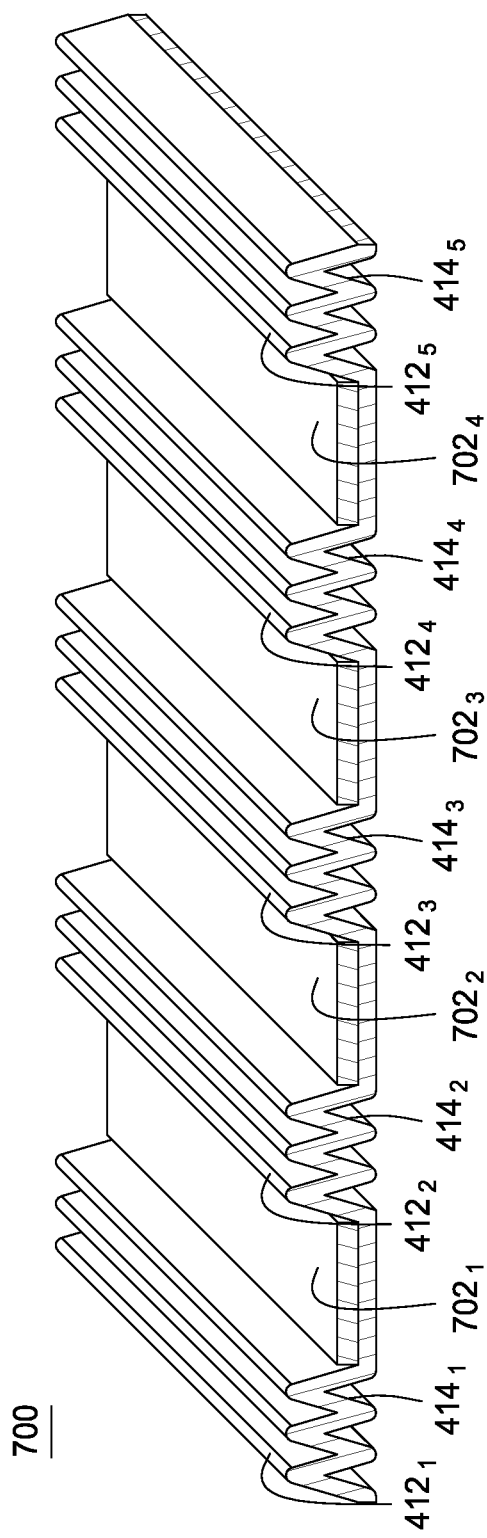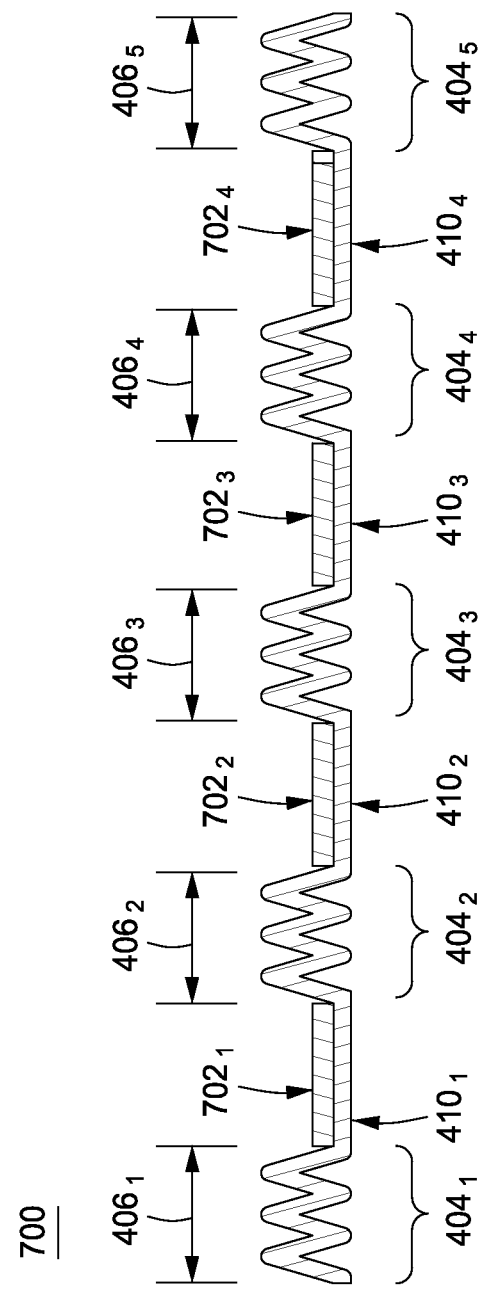

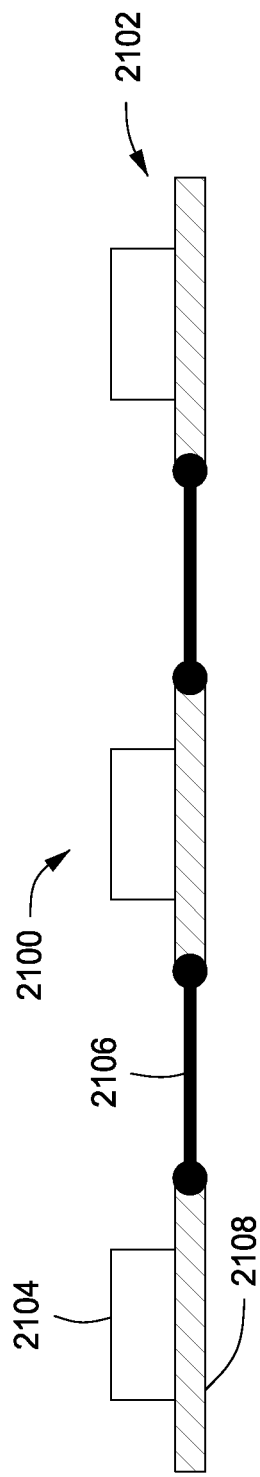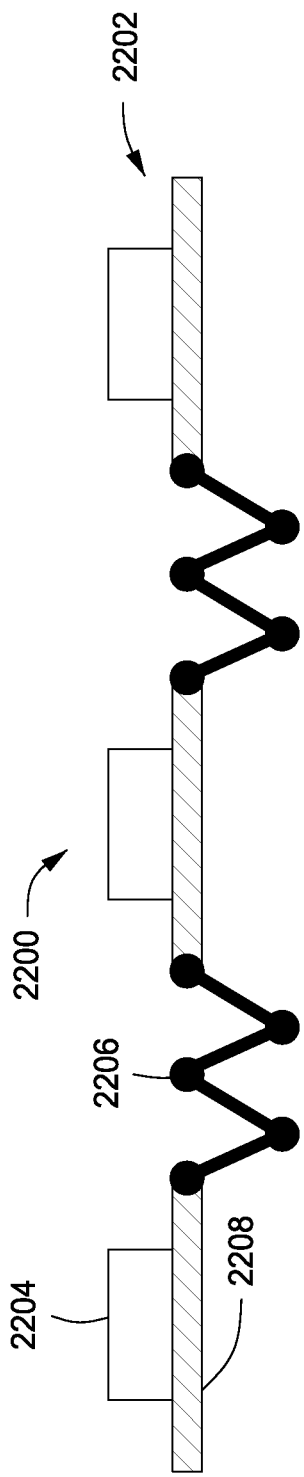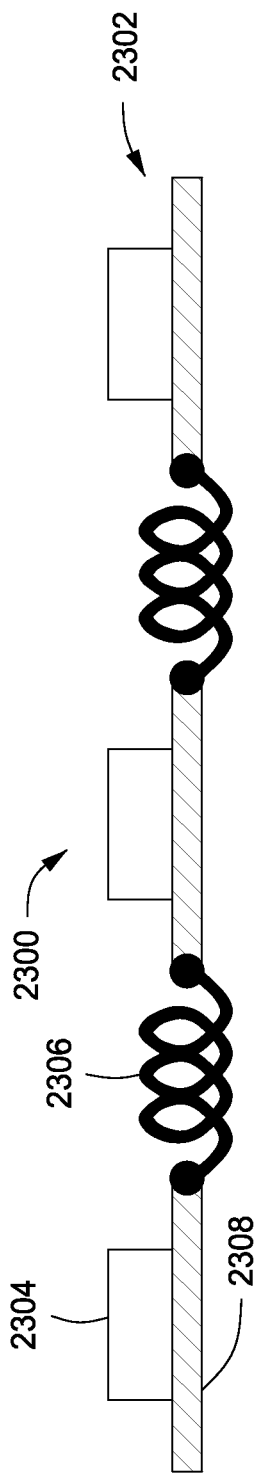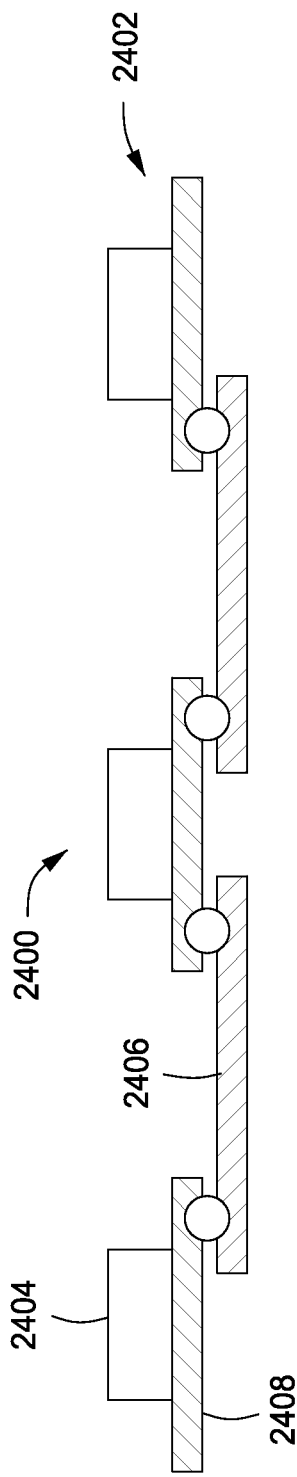

PHOTOVOLTAIC DEVICE HAVING A STRETCHABLE CARRIER

CROSS REFERENCE TO RELATED APPLICATION

This application is a continuation of co-pending U.S. patent application Ser. No. 12/381,588, filed Mar. 13, 2009, which is herein incorporated by reference in its entirety.

BACKGROUND

Field

The following relates generally to photovoltaic devices, and more particularly to stretchable photovoltaic devices and carriers that facilitate formation of the same.

Related Art

Renewable energy, unlike conventional energy, is generated by harnessing one or more potentially limitless supplies of naturally replenished natural resources, including, for example, sunlight, wind, rain, tides and geothermal heat. Because of being generated as such, a significant portion of the World's populace realizes that renewable energy is ever increasing in importance because, for example, renewable energy provides ways to supplant or augment conventional energy and/or to provide energy where conventional energy does not or cannot be distributed.

Given that most sources of renewable energy are environmentally clean, many consider renewable energy as a way of reducing detrimental effects to the environment (e.g., pollution, and in turn, global climate change) caused by generating conventional energy from fossil fuels. And given an ever decreasing supply of the fossil fuels and concerns over peak oil, many believe that, in the near future, the sources of renewable energy need not only to increase in amount, but also proliferate in type (each a "renewable-energy source").

In addition, certain renewable-energy sources may, as a result of inherent characteristics thereof, spur development of new applications and/or cause re-development of existing applications to take advantage such sources. For example, some of the renewable-energy sources may have an inherent characteristic of being able to provide power without being tethered to a remote distribution center. This characteristic may spur development of mobile and/or wireless applications, for example. Moreover, renewable energy may allow for deployment of certain types of applications that, but for a given type of source, would not be practicable. On the other hand, a need for a certain type of application may spur development of a new renewable-energy source or re-development of one or more of the renewable-energy sources.

Major contributors to current, worldwide generation of renewable energy are renewable-energy sources that employ a photovoltaic ("PV") effect. Pursuant to the PV effect, each of these renewable-energy sources ("PV source") generates energy, in the form of electricity, by harnessing electromagnetic radiation, such as sunlight, garnered from respective an environment proximate to such PV source.

Many applications for the PV source currently exist. These applications are not limited to any particular area of the world and/or any given sector of economy. In remote regions of the world, for example, an off-grid installation of the PV source provide the only available source of electricity. In highly populated and/or economically developed regions, the PV source may, for example, source electricity to an electrical grid to supplement and/or reduce the amount of conventional energy distributed from the electrical grid. Assuming that a cost per unit of energy provided from the PV source is less than a cost per unit of energy provided from a source of conventional energy, any savings in costs resulting from the PV source sourcing electricity to the electrical grid may be realized by utility companies and passed on to their customers.

To facilitate the foregoing in the past, a legacy PV source employs either a legacy PV panel or a legacy array of such PV panels ("photovoltaic-panel array"). Each of the legacy PV module and legacy photovoltaic-panel array typically includes a plurality of legacy PV cells (sometimes referred to as solar cells) that are electrically interconnected.

Each of these legacy PV cells is constructed either rigidly or to allow a limited amount of flexing or bending. Damage, and in turn, inoperability of any of the legacy PV cells occurs when such legacy PV cell is subjected to (i) a force beyond the limited amount of flexing or bending, and/or (ii) a force that would cause it to elongate and/or compress. Like the construction of the legacy PV cells, each of the legacy PV module and legacy photovoltaic-panel array are generally rigidly constructed so as to prevent damage to and inoperability of the legacy PV cells that would otherwise result from the aforementioned forces.

As can be readily discerned from the foregoing, the legacy PV source is not suitable for applications that require non-planar and/or arbitrary form factors. Therefore, there is a need in the art for a PV source suitable for applications that require non-planar and/or arbitrary form factors.

SUMMARY

A stretchable photovoltaic device, a stretchable photovoltaic module and a carrier for forming a stretchable photovoltaic device are provided. The stretchable photovoltaic device includes a stretchable part, at least one photovoltaic cell and a surface over which that at least one photovoltaic cell is disposed. The stretchable part has a given length that is operable to change in response to a force being applied to the device.

The given length may, for example, elongate when the force causes the device to elongate. Alternative and/or additionally, the given length may compress when the force causes the device to compress.

BRIEF DESCRIPTION OF THE DRAWINGS

So the manner in which the above recited features are attained and can be understood in detail, a more detailed description is described below with reference to Figures illustrated in the appended drawings.

The Figures in the appended drawings, like the detailed description, are examples. As such, the Figures and the detailed description are not to be considered limiting, and other equally effective examples are possible and likely. Furthermore, like reference numerals in the Figures indicate like elements, and wherein:

FIGS. 5A, 5B and 5C, are simplified plan view diagrams illustrating first, second and third form factors of a stretchable carrier;

FIGS. 7A and 7B are simplified plan view diagrams illustrating an example stretchable photovoltaic device;

Figure 14:
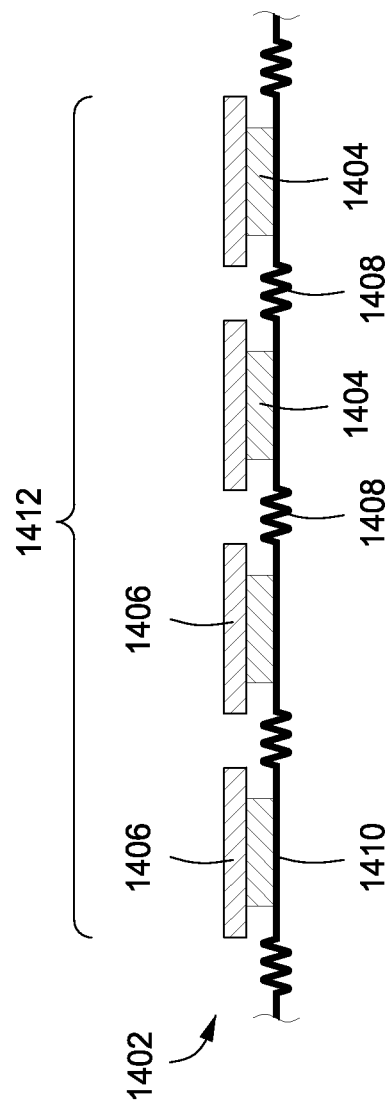
Figure 15:
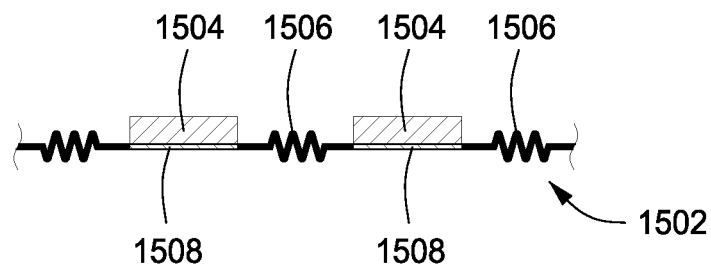
Figure 16:
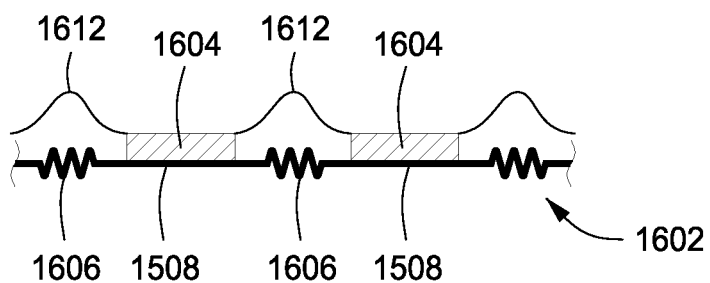
Figure 17A:
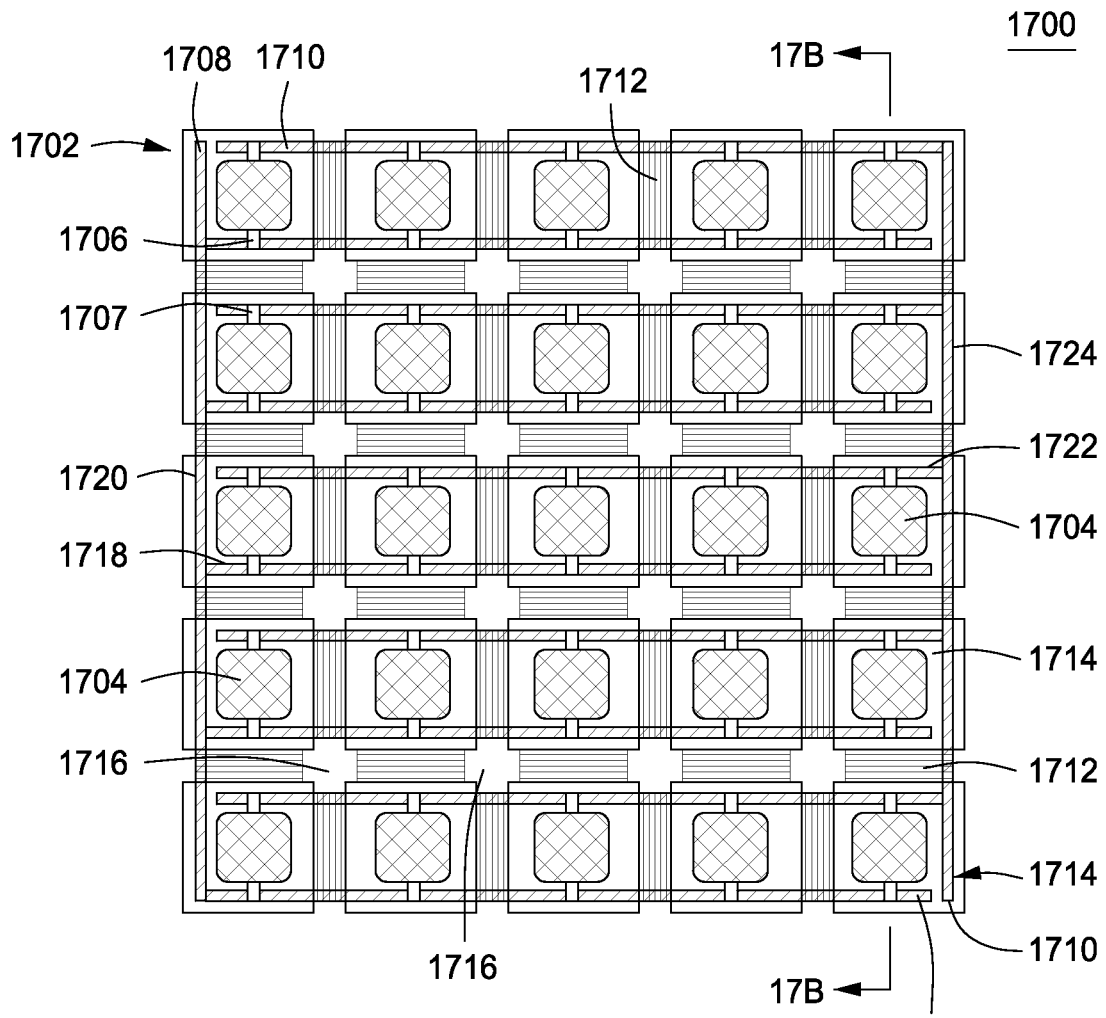
Figure 17B:
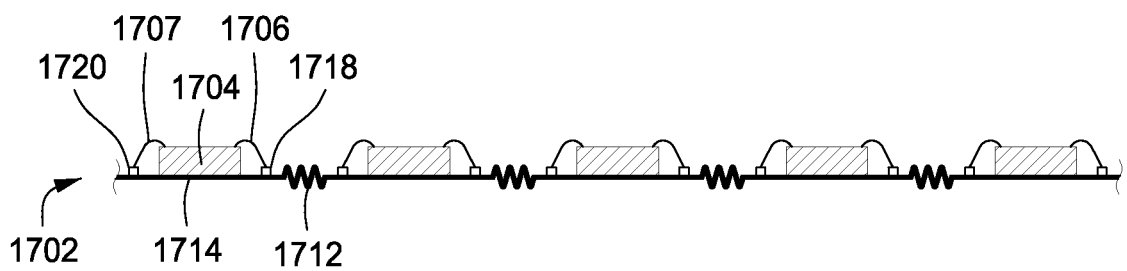
Figure 18A:
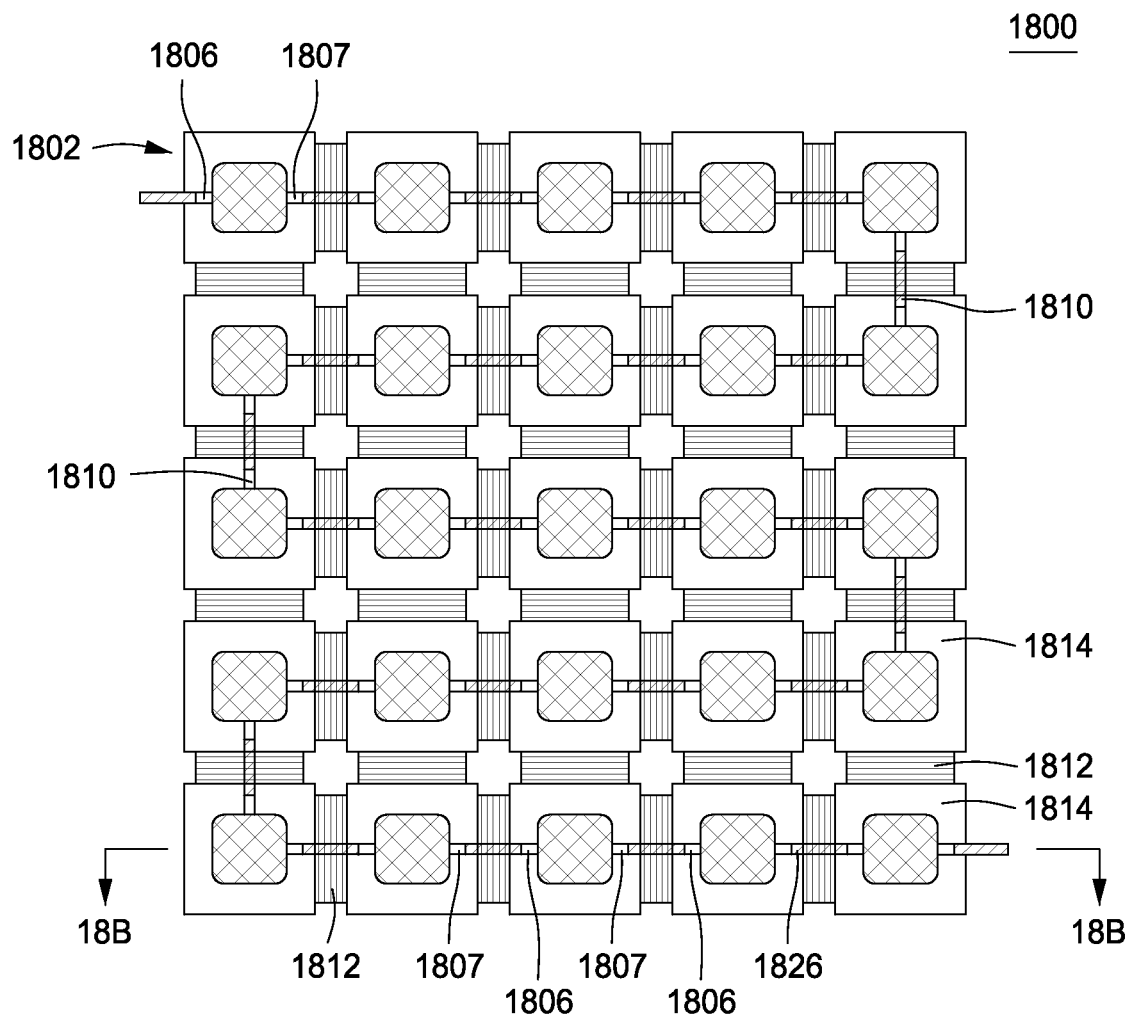
Figure 18B:
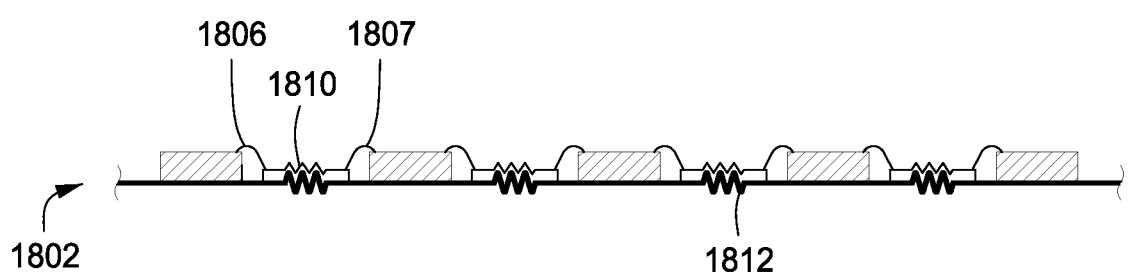
Figure 19:
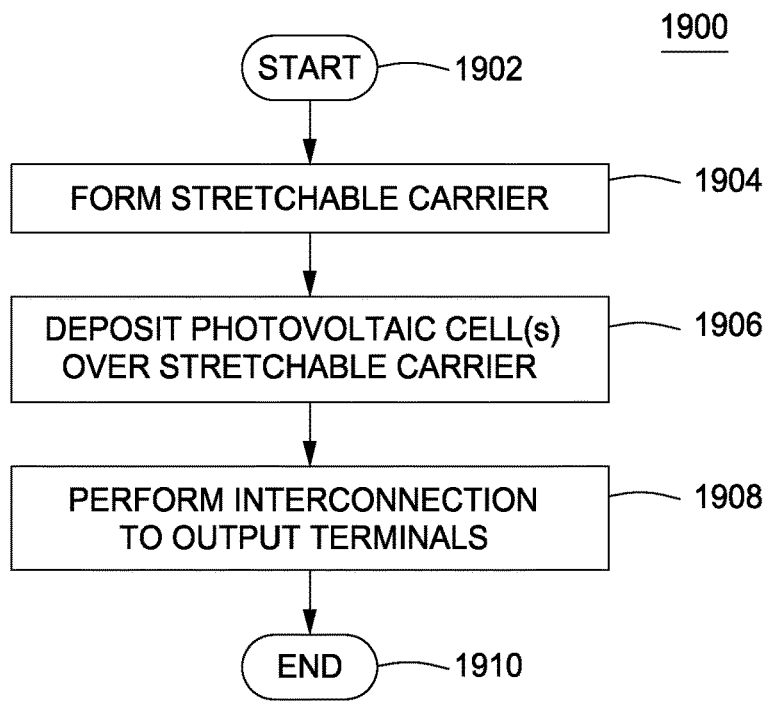
Figure 20:
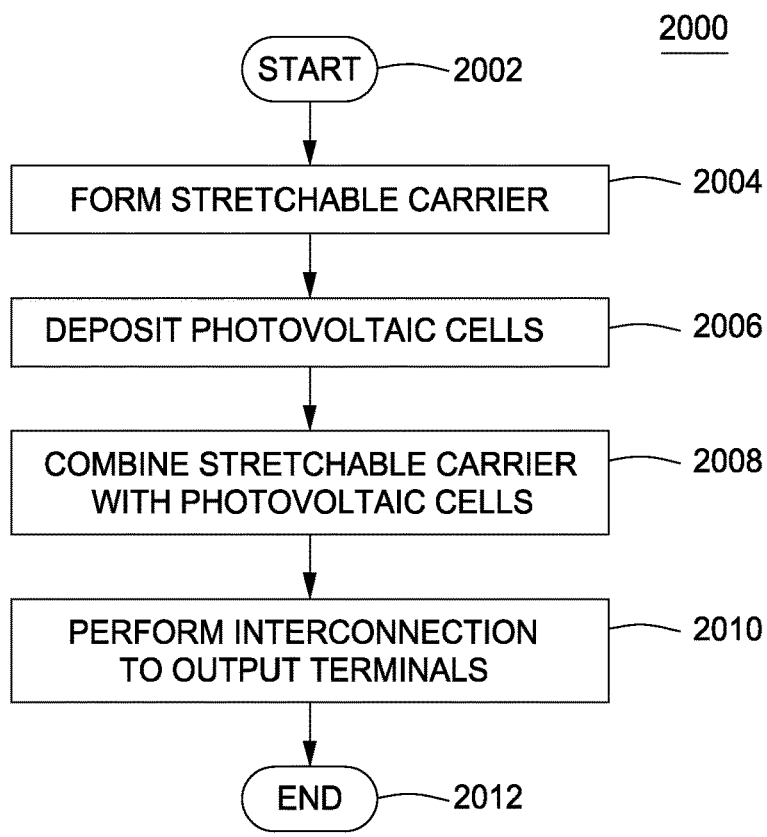
Figure 25:
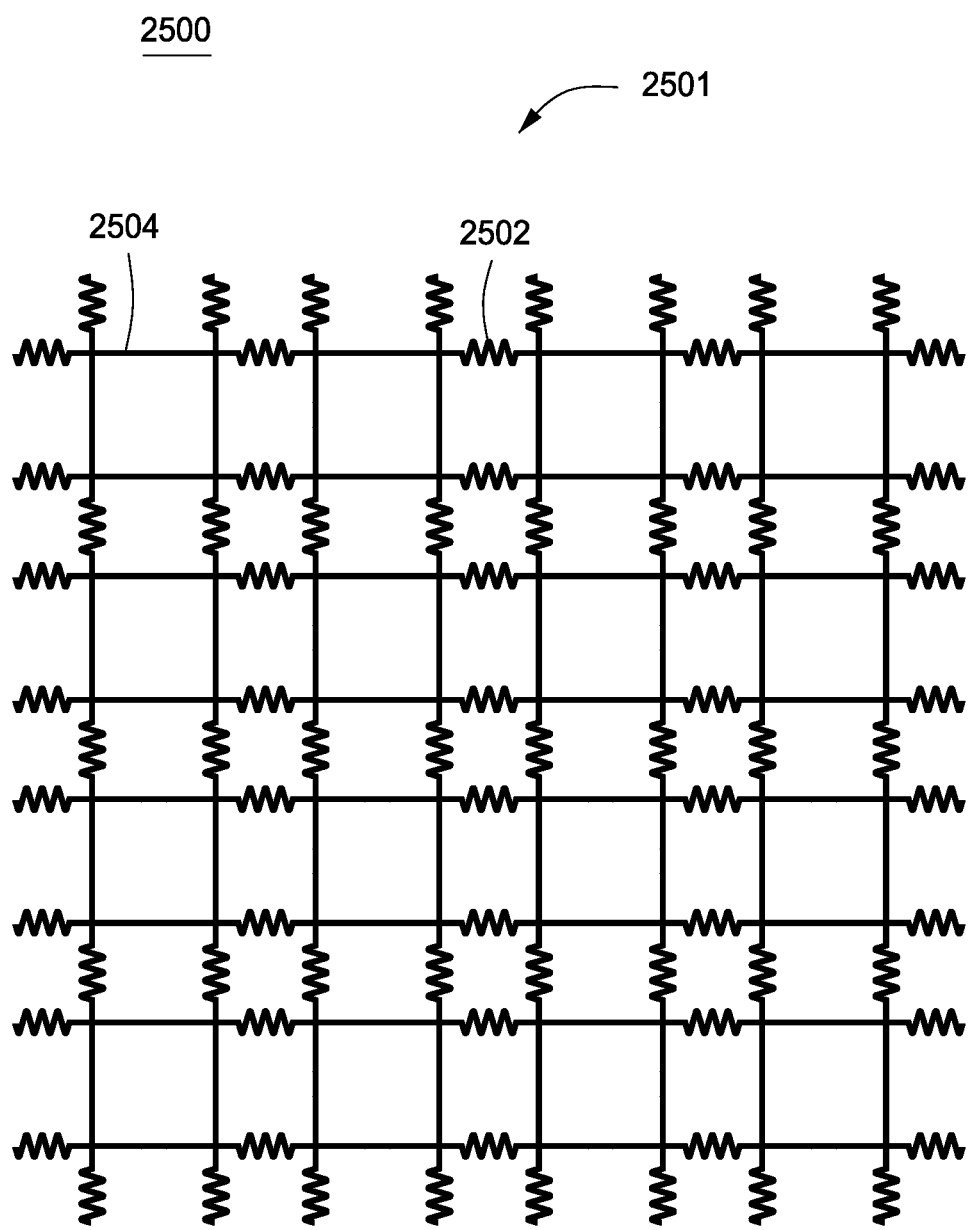
Figure 26:
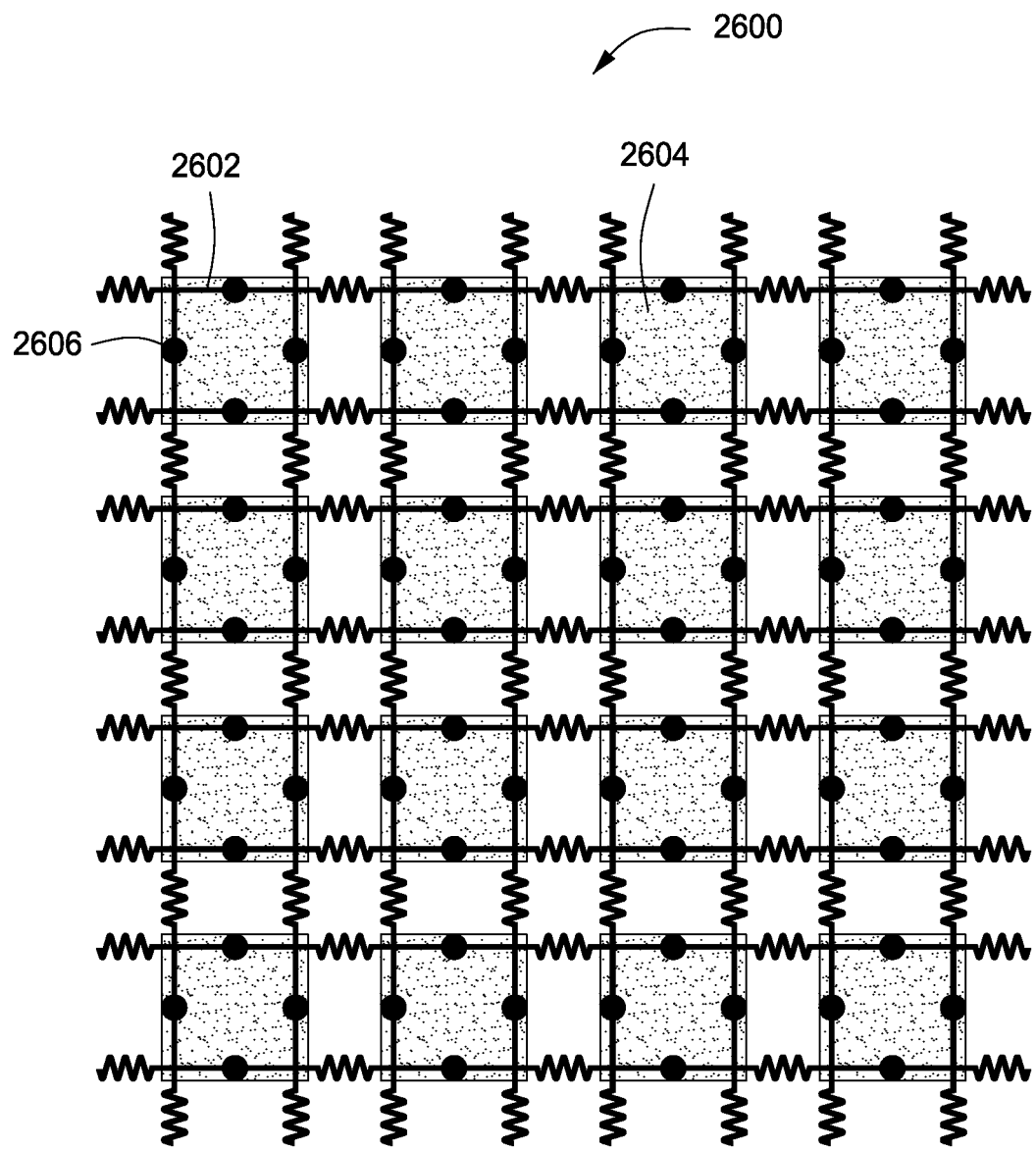

to FIG. 14 is a simplified plan view diagram illustrating an example stretchable photovoltaic device;

FIG. 15 is a simplified plan view diagram illustrating an example stretchable photovoltaic device;

FIG. 16 is a simplified plan view diagram illustrating an example stretchable photovoltaic device;

FIGS. 17A and 17B are simplified plan view diagrams illustrating an example stretchable PV device 1700;

FIGS. 18A and 18B are simplified plan view diagrams illustrating an example stretchable PV device;

FIG. 19 is a flow diagram illustrating an example process for forming a stretchable photovoltaic device under monolithic formation;

FIG. 20 is a flow diagram illustrating an example process 1900 for forming a stretchable photovoltaic device under hybrid formation;

FIGS. 21 through 24 depict simplified plan view diagrams illustrating example stretchable PV device 2100 having different types of stretchable parts according to some embodiments of the invention;

FIG. 25 depicts a stretchable carrier formed entirely of a wire mesh according to some embodiments of the invention; and FIG. 26 depicts a stretchable carrier and a plurality of PV cells according to some embodiments of the invention.

DETAILED DESCRIPTION

In the following detailed description, numerous specific details are set forth in order to provide a thorough understanding of exemplary embodiments or other examples described herein. However, it will be understood that these embodiments and examples may be practiced without the specific details. In other instances, well-known methods, procedures, components and circuits have not been described in detail, so as not to obscure the following description. Further, the embodiments disclosed are for exemplary purposes only and other embodiments may be employed in lieu of, or in combination with, the embodiments disclosed.

As used herein, the term "stretchable" describes a behavior of a given dimension (e.g., any of a length, width and height) of the stretchable photovoltaic ("PV") device, stretchable PV module, carrier for facilitating formation of a stretchable PV device or module or one or more elements thereof (each a "stretchable element"); this behavior being that the given dimension changes in response to a force being applied to at least a portion of the stretchable element. For example, the term stretchable describes the behavior of the given dimension, responsive to the force subjecting the stretchable element to an elongation ("elongating force"), to elongate from an untensioned condition. The term stretchable may also describe the behavior of the given dimension, responsive to the force subjecting the stretchable element to a compression ("compressing force"), to compress from the untensioned condition.

The term stretchable also describes the behavior of the given dimension to return to (or, to a substantial degree to) the unchanged condition or, alternately, to remain in its changed condition after releasing the force being applied to at least a portion of the stretchable element. This may include, for example, the behavior of the given dimension to return to (or, to a substantial degree to) the untensioned condition after releasing any of the elongating or compressing forces applied to the stretchable element. Alternatively, the term stretchable may describe the behavior of the given dimension to remain in an elongated or in a compressed condition after releasing the elongating force or the compressing force, respectively.

Figure 1A:
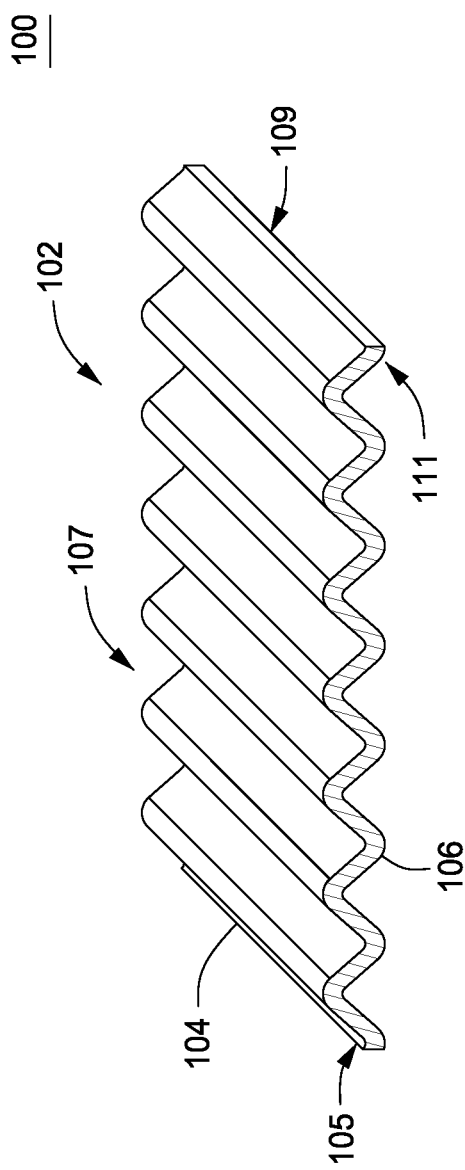
FIGS. 1A and 1B are simplified plan view diagrams illustrating an example carrier for facilitating formation of any of a stretchable photovoltaic device and stretchable photovoltaic module.
Figure 1B:
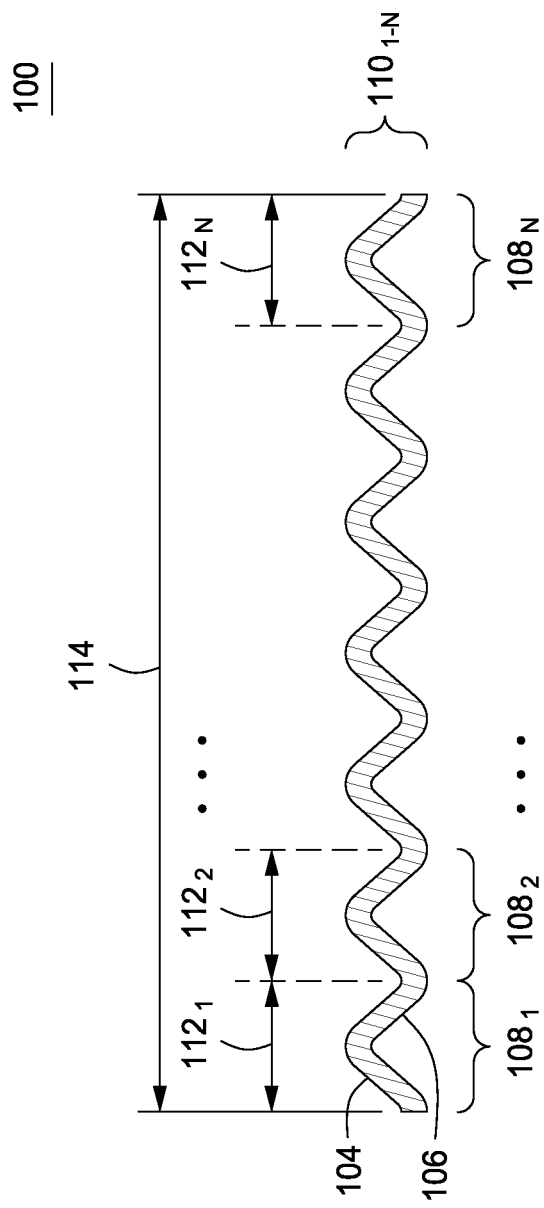

FIGS. 1A and 1B are simplified plan view diagrams illustrating an example carrier 100 for facilitating formation of any of a stretchable PV device and stretchable PV module. The carrier 100 includes a stretchable substrate 102. The stretchable substrate 102 defines an upper surface 104, a lower surface 106, a plurality of corrugations $108_1 \ldots 108_n$, and side edges 105, 107, 109 and 111

The upper surface 104 defines an upper-surface area, which is delimited by the side edges 105-111. In addition, the upper surface 104 provides a foundation onto or over which one or more PV cells (not shown) may be disposed. This foundation ("PV-supporting foundation") may include the entire upper-surface area or, alternatively, one or more portions of the upper-surface area. In the latter case, the portions of the upper surface area may be contiguous or, alternatively, dispersed.

The corrugations $108_1 \ldots 108_n$ may be, for example, periodic or non-periodic undulations. The corrugations $108_1 \ldots 108_n$ have corresponding amplitudes ("corrugation amplitudes") $110_1 \ldots 110_n$ and widths ("corrugation widths") $112_1 \ldots 112_n$. Each of the corrugation amplitudes $110_1 \ldots 110_n$ may have the same dimensions, and in turn, each of the corrugation widths $112_1 \ldots 112_n$ may have the same dimensions. Alternatively, one or more of the corrugation amplitudes $110_1 \ldots 110_n$ may differ, and/or one or more of the corrugation widths $112_1 \ldots 112_n$ may differ.

Together, the corrugation widths $112_1 \ldots 112_n$ define a length ("stretchable-part length") 114 of the stretchable substrate 102. The stretchable substrate 102 includes or is formed from one or more materials, such as metal or plastic foils, which allow one or more of the corrugation widths $112_1 \ldots 112_n$, and in turn, the corresponding corrugation amplitudes $110_1 \ldots 110_n$ to change (e.g., bend, elongate or compress) responsive to one or more forces (e.g., bending, elongating and/or compressing forces) applied to the carrier 100 or stretchable substrate 102. Changes to the corrugation widths $112_1 \ldots 112_n$, and in turn, resultant changes to the corrugation amplitudes $110_1 \ldots 110_n$ result in the stretchable-part length 114 changing its previous state.

Although the foregoing describes the upper surface 104 as providing the PV-supporting foundation, the lower surface 106 may instead provide the PV-supporting foundation. Alternatively, the upper surface 104 may provide a first PV-supporting foundation for a first set of PV cells, and the lower surface 106 may provide a second PV-supporting foundation for a second set of PV cells. This way, the carrier 100 may facilitate forming a PV device or module that has PV cells facing in more than one direction.

Figure 2A:
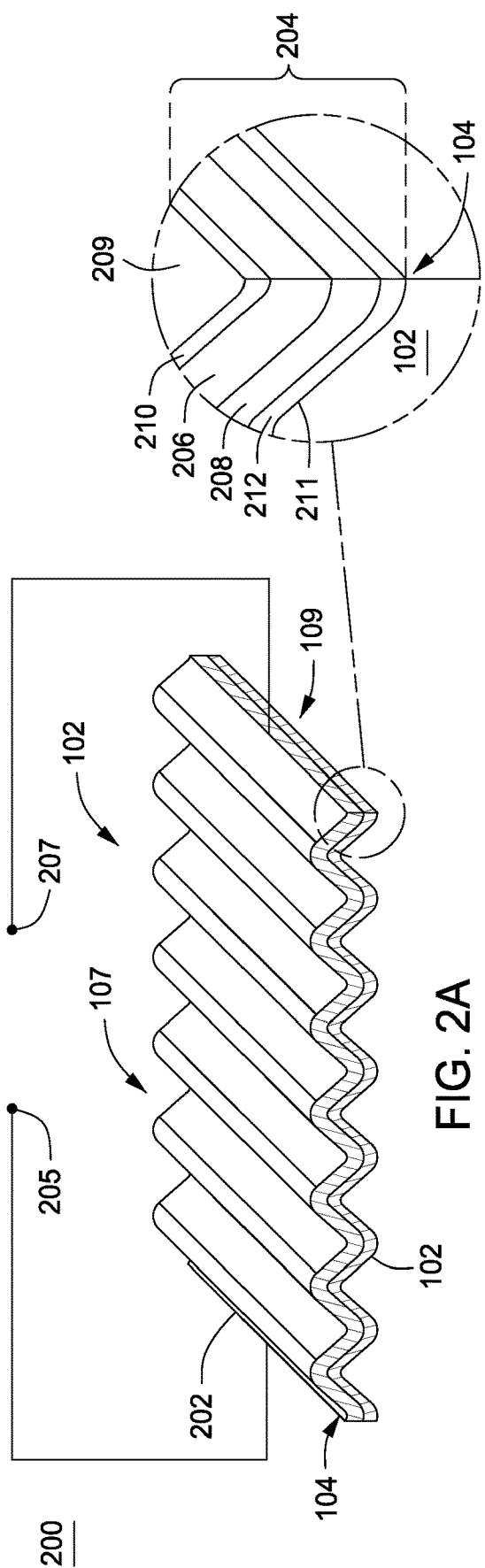
FIGS. 2A and 2B are simplified plan view diagrams illustrating an example stretchable photovoltaic device.
Figure 2B:
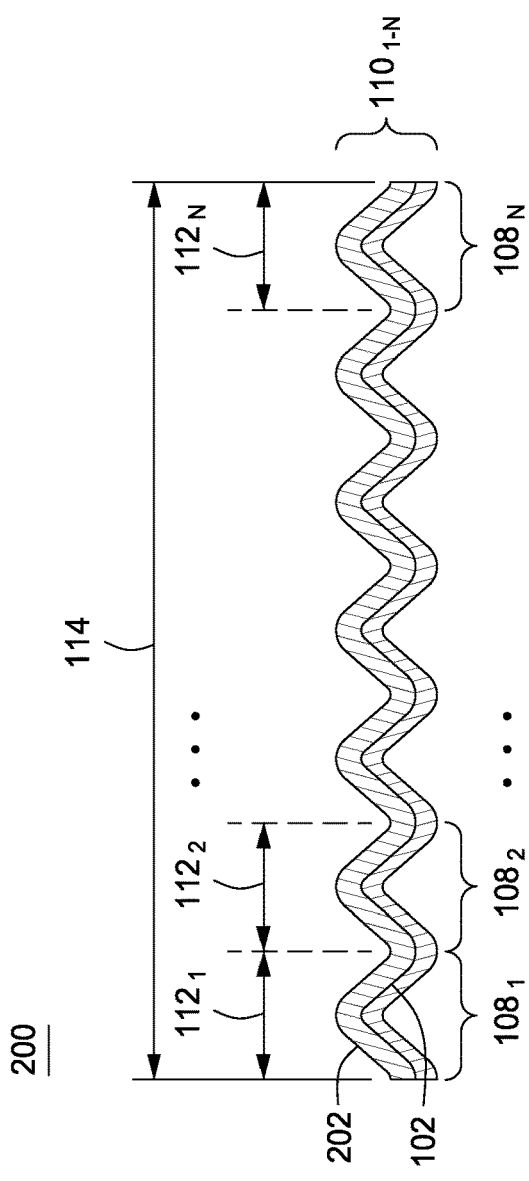

FIGS. 2A and 2B are simplified plan view diagrams illustrating an example stretchable PV device 200. The stretchable PV device 200 includes the stretchable substrate 102 (FIG. 1) and a PV cell 202.

The stretchable PV device 200 also includes first and second output terminals 205, 207. A load (not shown) may be coupled between the first and second output terminals 205, 207 to permit a flow of a current. In operation, the current may flow (in terms of electron movement) to the first output terminal 205, thereby placing the first output terminal 205 at a potential greater than that of the second output terminal 207. Therefore, for the sake of convention, the first output terminal 205 may be referred to as a "positive" output terminal 205, and the second output terminal 207 may be referred to as an "negative" output terminal 207.

The PV cell 202 may include a PV stack 204 (FIG. 2A) along with first and second conductors 209, 211. The PV stack 204 may include one or more layers ("PV-stack layers") made from thin-film materials. The PV-stack layers may include, for example, front and back contact layers 210, 212 that sandwich n-type and p-type semiconductor layers 206, 208, which together form a single PV junction. The contact layers 210 and 212 may be connected to either output terminal 205 or terminal 207. The PV-stack layers may also include one or more optional buffer and other purpose layers (not shown) interleaved between the front and back contact layers 210, 212 or, alternatively, positioned outside of the front and/or back contact layers 210, 212. To increase efficiency over that afforded by the single PV junction, the PV stack 204 may define multiple PV junctions. To facilitate this, the PV-stack layers may include additional sets of n-type and p-type semiconductor layers.

The thin-film materials for forming the n-type and p-type semiconductor layers 206, 208 may include any of amorphous silicon ("a-Si"), copper-indium-gallium diselenide ("CIGS"), cadmium telluride ("CdTe"), alloys of CdTe ("CdTe alloys"), alloys of silicon germanium ("SiGe alloys"), conducting polymers and oligomers. The thin-film materials for forming the front and back contact layers 210, 212 and the buffer and other purpose layers generally depend upon the materials of the n-type and p-type semiconductor layers 206, 208, and as such, may be materials that are compatible with the a-Si, GIGS, CdTe, CdTe alloys, SiGe alloys, quantum dots, organic dyes, conducting polymers and oligomers.

To increase efficiency over that afforded by the single PV junction, the PV stack 204 may define multiple PV junctions. For example, the PV stack 204 may include a first junction having a GIGS layer with a characteristic bandgap in a range of 1.75 eV, and a second junction have a GIGS layer with a characteristic bandgap in a range of 1.1 eV, thereby providing a conversion efficiency in a range of 15-25%, The PV stack 204 may define additional PV junctions as well.

To facilitate the additional PV junctions, the PV stack 204 may include an additional set of n-type and p-type semiconductor layers for each of the additional PV junction. The thin-film materials for forming each of these sets may differ from the thin-film materials of the n-type and p-type semiconductor layers 206, 208. For example, the thin-film materials of the n-type and p-type semiconductor layers 206, 208 may be copper-gallium selenide ($CuGaSe_2$ or "CGS") and the thin-film materials of another set of n-type and p-type semiconductor layers may be copper-indium diselenide ($CuInSe_2$ or "CIS"). CGS is, at least partially transparent; so positioning the n-type and p-type semiconductor layers 206, 208 closer than the other set of n-type and p-type semiconductor layers 206, 208 to incident electromagnetic radiation takes advantage of such transparency.

Although shown as being homogeneous and contiguous, each of the PV-stack layers may include portions of one or more of the other layers ("other-layer portions"), and/or other elements of the stack 204 ("miscellaneous-stack elements"), such as vias. The other-layer portions and/or the miscellaneous-stack elements may be wholly contained within one or a subset of the PV-stack layers. Alternatively, the other-layer portions and/or the miscellaneous-stack elements may extend through the entire or substantially all of the stack 204.

The first and second conductors 209, 211 may be coupled to additional and optional front and back contact layers 210, 212, respectively. To facilitate this, the first and second conductors 209, 211 are made from electrically conductive materials that are compatible with the thin-film materials of the front and back contact layers 210, 212. Furthermore, conductors 209 and 211 may be produced in the form of strip lines, busbars, grids, and the like. Additional layers for mechanical support and/or electrical insulation may be included in the PV stack 204.

The first and second conductors 209, 211 permit the current to flow to and/or from the front and back contact layers 210, 212. The current may flow to the front contact layer 210 or, alternately, to the back contact layer 212 depending on the thin-film materials used for the n-type and p-type semiconductor layers 206, 208. For example, in an operating GIGS-type cell, electrons flow from front contact 210 into contact layer 212 so that conductor 209 may be coupled to the negative terminal and conductor 211 may be connected to the positive terminal.

If the thin-film materials used for the n-type and p-type semiconductor layers 206, 208 dictate that the current flows to the front contact layer 210, then (i) the first conductor 209 may couple the front contact layer 210 to the first-output terminal 205; and (ii) the second conductor 211 may couple the back contact layer 212 to the second-output terminal 207. If, on the other hand, the thin-film materials used for the n-type and p-type semiconductor layers 206, 208 dictate that the current flows to the back contact layer 212, then the first conductor 209 may interconnect the back contact layer 212 to the first-output terminal 205; and the second conductor 211 may interconnect the front contact layer 212 to the second-output terminal 207. Depending on locations of the first and second output terminals 205, 207, the first conductor 209 and/or the second conductor 211 may include respective vias to facilitate appropriate interconnection of the first and second output terminals 205, 207.

The PV cell 202 may be disposed onto the upper surface 104 of the stretchable substrate 102 such that the entire or substantially all of the back-contact layer 212 affixes to the upper surface 104 and conforms to the undulating corrugations $108_1 \ldots 108_n$. Alternatively, the PV cell 202 may be disposed onto the upper surface 104 such that the back-contact layer 212 affixes to upper surface 104 only at certain locations with or without conforming to the undulating corrugations $108_1 \ldots 108_n$. This way, the PV cell 202 and the stretchable substrate 102 may elongate and/or compress at different rates, and/or within different limits of elongation and/or compression.

Although not shown, the stretchable PV device 200 may include one or more buffer layers between the PV cell 202 and the stretchable substrate 102 to facilitate reduction of stresses and/or strains due to the PV cell 202 and the stretchable substrate 102 having different rates of elongation and/or compression, and/or having different limits of elongation and/or compression. And depending on desired orientation of the stack 204 and/or application, a layer of the stack 204 other than the back-contact layer 212 (e.g., a buffer layer of the stack 204) may be disposed onto or over the upper surface 104 of the stretchable substrate 102. Additionally, the stretchable PV device 200 may include a plurality of PV cells, even though it is shown as including only one PV cell, namely, PV cell 202. Each of the plurality of PV cells may include one or more PV junctions.

As described in more detail below, the stretchable PV device 200 may be formed monolithically (i.e., undergo "monolithic formation") or hybridly (i.e., undergo "hybrid formation"). Under monolithic formation, the stretchable PV device 200 may be formed by (i) forming the stretchable substrate 102, (ii) depositing the PV cell 202 or plurality of PV cells onto or over the upper surface 104 of the stretchable substrate 102, and (iii) then carrying out appropriate post-deposition processes (e.g., using any of mechanical and laser scribing to monolithically interconnect the plurality of PV cells).

Under hybrid formation, the stretchable PV device 200 may be formed by forming the stretchable substrate 102 and the PV cell 202 or plurality of PV cells separately from one another using separate processes. Thereafter, the PV cell 202 or plurality of PV cells may be affixed onto or over the upper surface 104 of the stretchable substrate 102 using a bonding agent or adhesive. After the PV cell 202 or plurality of PV cells become affixed to the stretchable substrate 102, appropriate post-affixing processes may be carried out. For example, the plurality of PV cells may be interconnected using any of wire bonds, corrugated tabs, tapes and like-type electrical interconnections. In generally, any other type of PV cells can be employed, including those on rigid substrates, to produce stretchable PV devices. For example, crystalline or polycrystalline silicone cells may be assembled on a stretchable carrier to produce a stretchable PV module. Other examples include GaAs single-junction cells, III-V multi-junction cells, CdTe cells on glass substrates, and like type PV cells on glass substrates.

Analogous to the carrier 100 of FIG. 1, the stretchable PV device 200 includes or is formed from one or more materials that allow one or more of the corrugation widths $112_1 \ldots 112_n$, and in turn, the corresponding corrugation amplitudes $110_1 \ldots 110_n$ to change responsive to one or more forces applied ("applied forces") to the stretchable PV device 200 or elements thereof. In one particular construction of the stretchable PV device 200, for example, the stretchable substrate 102 may be a foil that is formed from metals or metal alloys, including any of titanium, aluminum, copper, stainless steel, etc., and/or plastics, including any of polyimide, polyethylene, ethylene vinyl acetate ("EVA"), etc. The foil may have a thickness in a range of 10 to 200 microns or, alternatively, in a range of 25 to 100 microns. In the untensioned condition, the undulating corrugations $108_1 \ldots 108_n$ are in sinusoidal form; and the corrugation widths $112_1 \ldots 112_n$ and corrugation amplitudes $110_1 \ldots$ $110_n$ may have periods and amplitudes in a range of 0.1 to 20 mm or, alternatively, in a range of 0.5 to 10 mm. One or more of these periods and amplitudes may exhibit changes responsive to the applied forces.

In response to the applied forces causing one or more of the corrugation amplitudes $110_1 \ldots 110_n$ to flatten from the untensioned condition, for example, may cause widening of the corresponding corrugation widths $112_1 \ldots 112_n$. This widening results in increases in the periods of the corresponding corrugation widths $112_1 \ldots 112_n$ from the untensioned condition. Alternatively and/or additionally, the corresponding corrugation widths $112_1 \ldots 112_n$ may undergo narrowing in response to the applied forces causing one or more of the corrugation amplitudes $110_1 \ldots 110_n$ to increases in amplitude from the untensioned condition. The narrowing results in decreases in the periods of the corresponding corrugation widths $112_1 \ldots 112_n$ from the untensioned condition.

The changes to the periods of the corrugation widths $112_1 \ldots 112_n$, and in turn, resultant changes amplitudes to the corrugation amplitudes $110_1 \ldots 110_n$ (or vice versa) result in the stretchable-part length 114 exhibiting a change ("stretchable-part-length change") from the untensioned condition or, alternatively, another previous state (e.g., a state other than the untensioned condition). The stretchable-part-length change is indicative of the stretchable-part length 114 in a condition ("changed condition") that results from the stretchable substrate 102 being subjected to the applied forces.

To facilitate determining the stretchable-part-length change, the stretchable-part length 114 may define first and second measures that may be measured in accordance with given units of measure of a reference or standard for measuring physical dimensions (e.g., meters). These first and second measures may represent, for example, the stretchable-part length 114 in the untensioned condition or previous state ("previous-length measure") and the stretchable-part length 114 in the changed condition ("changed-length measure"), respectively. The stretchable-part-length change may be or be indicative of a difference between the previous-length and changed-length measures.

Given the corrugations $108_1 \ldots 108_n$, the stretchable-part-length change, in general, is proportional to a ratio of the corrugation amplitudes $110_1 \ldots 110_n$ to the corrugation widths $112_1 \ldots 112_n$. And relative to the untensioned condition or other previous state, the stretchable-part-length change may be in excess of one-hundred percent of the untensioned-length measure. This may occur, for example, when any one of the corrugation amplitudes $110_1 \ldots 110_n$ is larger than its corresponding corrugation widths $112_1 \ldots 112_n$. The changed-length measure may have a maximum that is less than complete extension or compression of the corrugation widths $112_1 \ldots 112_n$ (i.e., less than maximum displacement or complete flattening of the corrugation amplitudes $110_1 \ldots 110_n$) due to restrictions imposed by properties of the PV stack 204. These restrictions may include, for example, one or more maximum stress levels established to prevent micro-cracking and/or other failure mechanisms caused by over stressing the PV stack 204 or elements thereof.

Figure 3:
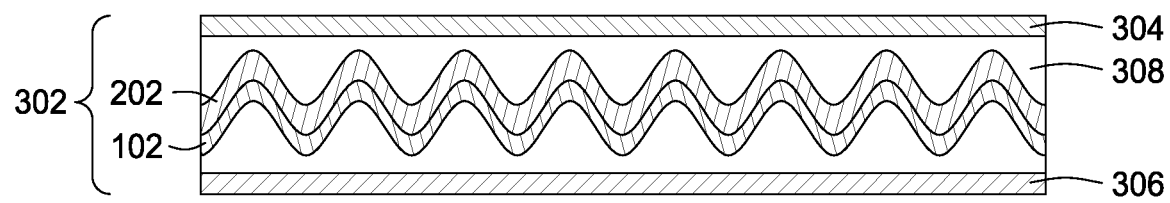
FIG. 3 is a simplified plan view diagram illustrating an example stretchable photovoltaic device.

Referring now to FIG. 3, a simplified plan view diagram illustrating a cross section of an example stretchable PV device 300 is shown. The stretchable PV device 300 is similar to the stretchable PV device 200 of FIG. 2, except as described below. The stretchable PV device 300 includes an encapsulation 302. This encapsulation 302 that encapsulates the stretchable PV device 200. The encapsulation includes first and second coversheets 304, 306 separated by a thick layer of encapsulating material 308.

The encapsulating material 308 may be liquid, viscous, gelatinous or elastic so that the stretchable PV device 300 has a range of motion that is substantially equivalent to or at least not appreciably limited over a range of motion of afforded by the stretchable PV device 200 within the encapsulation 302. One example of a suitable material for the encapsulation material 308 is silicone.

The coversheets 304, 306 may be elastic or elastic-like materials so that the range of motion of the stretchable PV device 300 is substantially equivalent to or at least not appreciably limited over the range of motion of the stretchable PV device 200 within the encapsulation 302. One example of a suitable material for any of the coversheets 304, 306 is a sheet formed from latex.

Alternatively, any of the coversheets 304, 306 and encapsulating material 308 may include materials that can be made to entirely, substantially or otherwise limit the range of motion of the stretchable PV device 300. These materials may include, for example, heat-activated and/or catalyst-inhibited passivation gelatins or sheets that remain in a flexible or semi-flexible state until being exposed to heat or a chemical reaction, whereupon the encapsulation 302 hardens to any number of degrees of hardness. Under this construction, the stretchable PV device 300 may be formed or worked into a desired shape or form factor when the encapsulation 302 is in the flexible or semi-flexible state, and after achieving the desired shape, the encapsulation 302 may undergo hardening to achieve a given degree of hardness.

The given degree of hardness may limit the range of motion of the stretchable PV device 300 so as to allow for elastic or elastic-like bending or plastic or plastic-like deformation, but not elongation or stretching. Alternatively, the given degrees of hardness may make the stretchable PV device 300 rigid or otherwise un-stretchable.

As an alternative, the encapsulation 302 might not include the encapsulating material 308, and the coversheets 304, 306 may be inelastic materials, such as thermoplastic, composite plastics, acrylic glass and metal foils. Under this construction, the stretchable PV device 200 may be formed or worked into a desired shape or form factor. Thereafter, the coversheets 304, 306 may be applied to encapsulate, at least in part, the stretchable PV device 200 to achieve the given degree of hardness, and in turn, maintain the stretchable PV device 300 in the desired shape or form factor.

Maintaining the stretchable PV device 300 in the desired shape or form factor beneficially improves reliability and performance over a lifetime of the PV device 300. A wider range of packaging materials, particularly inflexible materials, may be used. In any case, the encapsulation 302 may afford protection against degradation of the PV device 200 and the elements thereof, including for example, the first and second conductors 209, 211 and exposed layers of the PV stack 204, caused by moisture, oxidation, and other chemical and/or mechanical detrimental effects.

As shown, the encapsulation 302 entirely encapsulates the stretchable PV device 200. The encapsulation 302, however, may only encapsulate a portion of the stretchable PV device 200.

Figure 4A:
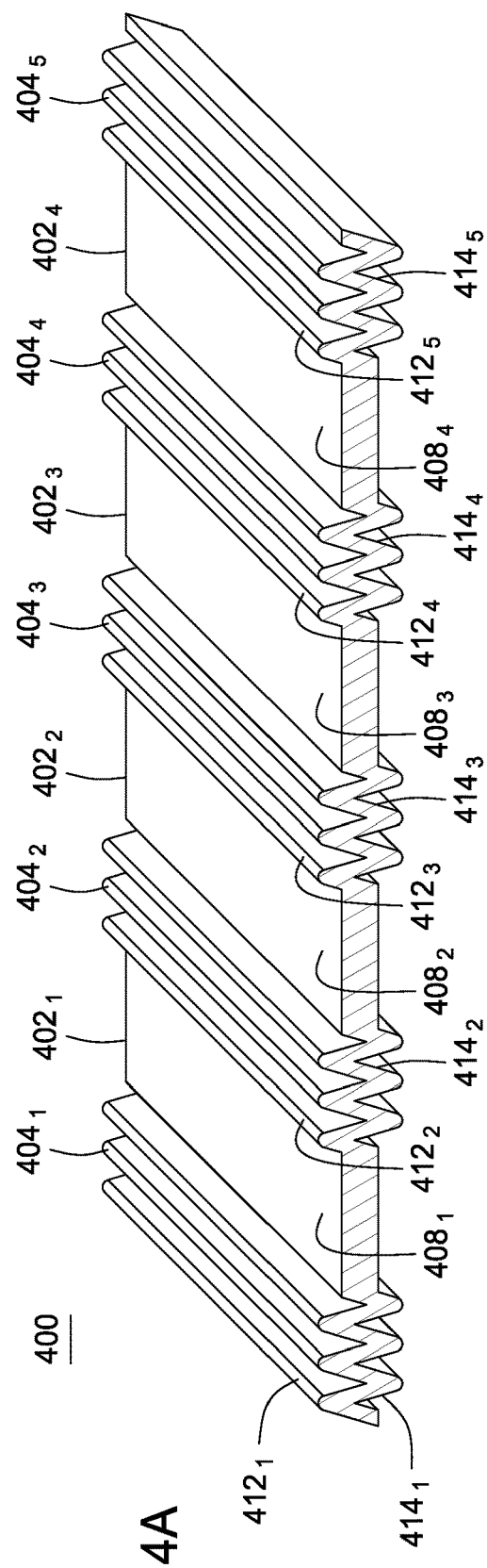
FIGS. 4A and 4B are simplified plan view diagrams illustrating an example carrier for facilitating formation of any of a stretchable photovoltaic device and stretchable photovoltaic module.
Figure 4B:
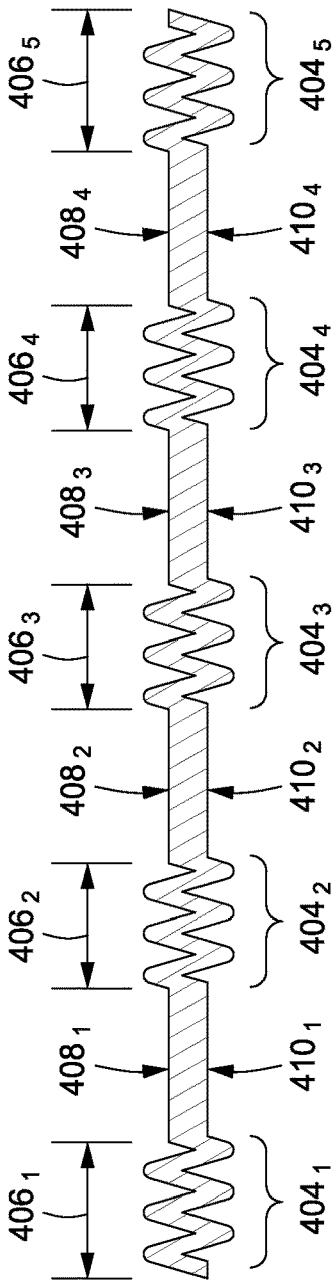

FIGS. 4A and 4B are simplified plan view diagrams illustrating an example stretchable carrier 400 for facilitating formation of any of a stretchable PV device and stretchable PV module. The stretchable carrier 400 includes a concatenation of five stretchable parts $404_1 \ldots 404_5$ (collectively "stretchable parts 404") and four mounting sites $402_1 \ldots 402_4$ (collectively "mounting sites 402") arranged in an alternating sequence starting with the first stretchable part $404_1$ and ending with the fifth stretchable part $404_5$.

Each of the stretchable parts $404_1 \ldots 404_5$ may include or embody the stretchable substrate 102 of FIG. 1, for example. The five stretchable parts $404_1 \ldots 404_5$ include respective sets of corrugations ("corrugation sets"). The corrugations of each of the corrugation sets may be, for example, periodic or non-periodic undulations, and have corresponding corrugation amplitudes and corrugation widths. Each of the corrugation amplitudes may be the same dimensionally, and in turn, each of the corrugation widths may be the same dimensionally. Alternatively, one or more of the corrugation amplitudes may differ, and/or one or more of the corrugation widths may differ.

The corrugation widths of the first corrugation set define a first stretchable-part length $406_1$. The corrugation widths of the second corrugation set define a second stretchable-part length $406_2$. The corrugation widths of the third corrugation set define a third stretchable-part length $406_3$. The corrugation widths of the fourth corrugation set define a fourth stretchable-part length $406_4$. And the corrugation widths of the fifth corrugation set define a fifth stretchable-part length $406_5$.

The first stretchable part $404_1$ includes or is formed from one or more materials, such as metal or plastic foils, which allow one or more of the corrugation widths of the first corrugation set, and in turn, the corresponding corrugation amplitudes of the first corrugation set to change responsive to one or more of the applied forces applied to the stretchable carrier 400 or the stretchable part $404_1$. The changes to the corrugation widths of the first corrugation set, and in turn, resultant changes to the corrugation amplitudes of the first corrugation set result in the first stretchable-part length $406_1$ changing from its previous state.

Each of the second, third, fourth and fifth stretchable parts $404_2 \ldots 404_5$ may be constructed differently from the first stretchable part $404_2$ or from materials that differ from the first stretchable part $404_1$. This may be beneficial in that the differing constructions and materials may provide differing amounts of resistance. For simplicity of exposition, however, the following assumes that each of the second, third, fourth and fifth stretchable parts $404_2 \ldots 404_5$ are the same or substantially the same as the first stretchable part $404_1$.

Each of the four mounting sites $402_1 \ldots 402_4$ may be flat or curved, rigid or flexible. The four mounting sites $402_1 \ldots 402_4$ include respective upper surfaces $408_1 \ldots 408_4$ and respective lower surfaces $410_1 \ldots 410_4$. Any of the four upper surfaces $408_1 \ldots 408_4$ and four lower surfaces $410_1 \ldots 410_4$ may provide a foundation onto or over which one or more PV cells (not shown) may be disposed. For simplicity of exposition, the following assumes that each of the four upper surfaces $408_1 \ldots 408_4$ provides the foundation onto or over which the PV cells may be disposed. And given that each of the four upper surfaces $408_1 \ldots 408_4$ defines a given surface area, the foundation may include either the entire surface area or portions thereof. In the latter case, the portions of the surface area may be contiguous or, alternatively, dispersed.

Like the four mounting sites $402_1 \ldots 402_4$, the five stretchable parts $404_2 \ldots 404_5$ include respective upper surfaces $412_1 \ldots 412_5$ and respective lower surfaces $414_1 \ldots 414_5$. Any of the five upper surfaces $412_1 \ldots 412_5$ and the five lower surfaces $414_1 \ldots 414_5$ may provide a foundation onto or over which one or more PV cells (not shown) may be disposed. For simplicity of exposition, the following assumes that each of the five upper surfaces $412_1 \ldots 412_5$ provides the foundation onto or over which the PV cells may be disposed. And given that each of the five upper surfaces $412_1 \ldots 412_5$ defines a given surface area, the foundation may include either the entire surface area or portions thereof. In the latter case, the portions of the surface area may be contiguous or, alternatively, dispersed.

Each of the five stretchable parts $404_2 \ldots 404_5$ may be, in whole or in part, electrically conductive, thermally conductive, electrically insulating and/or thermally insulating. Similarly, each of the four mounting sites $402_1 \ldots 402_4$ may be, in whole or in part, electrically conductive, thermally conductive, electrically insulating and/or thermally insulating. Each of the four mounting sites $402_1 \ldots 402_4$ may include (or have formed thereon) one or more electrically-conductive contact ("mounting-site contacts"). These mounting-site contacts may be positioned to couple to and/or couple to one or more conductors of PV cells disposed over the four mounting sites $402_1 \ldots 402_4$ (e.g., one or more of the first and second conductors 209, 211 of the PV cell 202 of FIG. 2). If coupled to such conductors, then the mounting-site contacts may be isolated by one or more electrically-insulating portions.

The mounting-site contacts may interconnect to other electrically-conductive portions of the four mounting sites $402_1 \ldots 402_4$ and/or electrically-conductive portions of the five stretchable parts $404_2 \ldots 404_5$ to form interconnection paths. These interconnection paths, as described in more detail below, may interconnect the PV cells in series and/or parallel.

Although the stretchable carrier 400, as shown, includes five stretchable parts $404_1 \ldots 404_5$ and four mounting sites $402_1 \ldots 402_4$, the carrier stretchable 400 may include more of fewer stretchable parts and/or mounting sites. And although the concatenation of the five stretchable parts $404_1 \ldots 404_5$ and four mounting sites $402_1 \ldots 402_4$ is shown as a linear concatenation, the concatenation may take other (e.g., geometric) forms as well.

Referring now to FIGS. 5A, 5B and 5C, simplified plan view diagrams illustrating first, second and third form factors 502, 504 and 506 of the stretchable carrier 400 of FIG. 4. The first form factor 502 defines an untensioned condition of the stretchable carrier 400. In the untensioned condition, the stretchable carrier 400 or the elements thereof are is not being subject to applied forces that cause any of the five stretchable-part lengths $406_1 \ldots 406_5$ to change.

The second form factor 504 defines a curved form of the stretchable carrier 400. In this condition, the stretchable carrier 400 and/or the elements thereof are being subject to one or more of the applied forces in multiple directions that, in turn, cause one or more of the five stretchable-part lengths $406_1 \ldots 406_5$ to elongate from the untensioned condition so as to cause the stretchable carrier 400 to exhibit an arc or semi-circular form.

The third form factor 506 defines a linear stretched condition of the stretchable carrier 400. In this linear stretched condition, the stretchable carrier 400 and/or the elements thereof are being subject to one or more of the applied forces in a direction X that, in turn, cause one or more of the five stretchable-part lengths $406_1 \ldots 406_5$ to elongate from the untensioned condition in the direction X so as to cause the stretchable carrier 400 to exhibit a lengthen form.

The first, second and third form factors 502-506 represent only a small fraction of the possible form factors of the stretchable carrier 400, any of which is easily discernable in view of the teachings herein. Moreover, certain form factors of the stretchable carrier 400 may result from varying rates of change of the five stretchable parts $404_1 \ldots 404_5$ (individually or collectively) and/or varying amounts of flexibility of the four mounting sites $402_1 \ldots 402_4$ (individually or collectively).

Figure 6A:
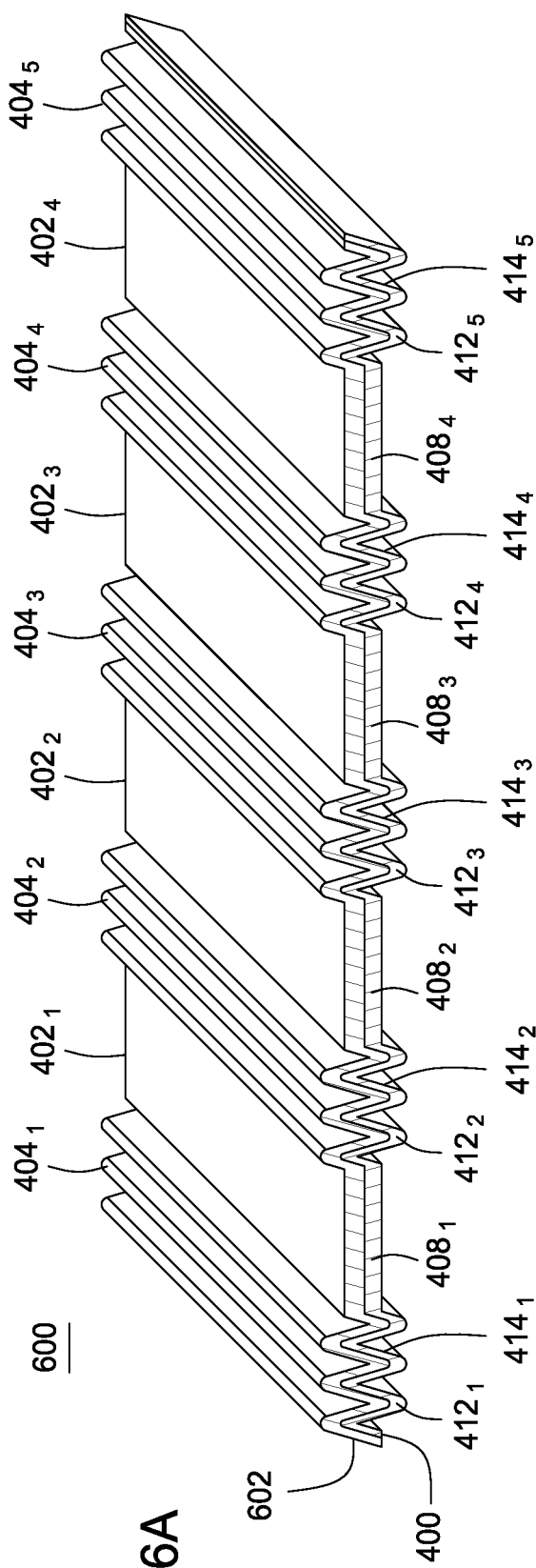
FIGS. 6A and 6B are simplified plan view diagrams illustrating an example stretchable photovoltaic device.
Figure 6B:
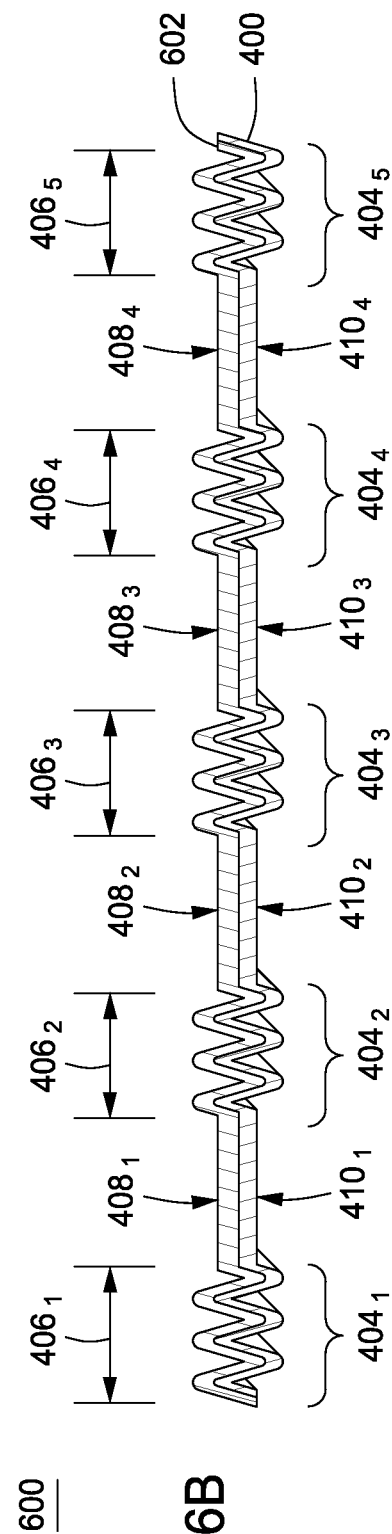

FIGS. 6A and 6B are simplified plan view diagrams illustrating an example stretchable PV device 600. The stretchable PV device 600 includes the stretchable carrier 400 (FIG. 4) and a PV cell 602. The PV cell 602 is similar to the PV cell 202 of FIG. 2A, except as described herein.

The PV cell 602 may be disposed onto each of the stretchable-part-upper surfaces $412_1 \ldots 412_5$ and each of the mounting-site-upper surfaces $408_1 \ldots 408_4$ (collectively "carrier-upper surface") such that the entire or substantially all of the back-contact layer 212 of the stack 204 affixes to such surfaces and conforms to the undulating corrugations of the five stretchable parts $404_1 \ldots 404_5$ and the forms of the four mounting sites $402_1 \ldots 402_4$. Alternatively, the PV cell 602 may be disposed onto the stretchable-part-upper surfaces $412_1 \ldots 412_5$ and each of the mounting-site-upper surfaces $408_1 \ldots 408_4$ such that the back-contact layer 212 of the stack 204 affixes to such surfaces only at certain locations and with or without conforming to any of the undulating corrugations of the five stretchable parts $404_1 \ldots 404_5$ or the forms of the four mounting sites $402_1 \ldots 402_4$. This way, the PV cell 602 and the five stretchable parts $404_1 \ldots 404_5$ may elongate and/or compress at different rates, and/or within different limits of elongation and/or compression.

Although not shown, the stretchable PV device 600 may include one or more buffer layers between the PV cell 602 and the carrier-upper surface to facilitate reduction of stresses and/or strains due to the PV cell 602 and the stretchable carrier 400 having different rates of elongation and/or compression, and/or having different limits of elongation and/or compression. And depending on desired orientation of the stack 204 and/or application, a layer of the stack 204 other than the back-contact layer 212 may be disposed onto or over the carrier-upper surface. Additionally, the stretchable PV device 600 may include a plurality of PV cells, even though it is shown as including only one PV cell, namely, PV cell 602.

Like the stretchable PV device 200, the stretchable PV device 600 may be formed monolithically or hybridily. Under monolithic formation, the stretchable PV device 600 may be formed by (i) forming the stretchable carrier 400, (ii) depositing the PV cell 602 or a plurality of PV cells onto or over carrier-upper surface, and then (iii) carrying out appropriate post-deposition processes (e.g., using any of mechanical and laser scribing to monolithically interconnect the plurality of PV cells).

Under hybrid formation, the stretchable PV device 600 may be formed by forming the carrier 400 and the PV cell 202 or plurality of PV cells separately from one another using separate processes. Thereafter, the PV cell 202 or plurality of PV cells may be affixed onto or over the carrier-upper surface using a bonding agent or adhesive. After the PV cell 202 or the plurality of PV cells become affixed to the stretchable carrier 400, appropriate post-affixing processes may be carried out. For example, the plurality of PV cells may be interconnected using any of wire bonds, corrugated tabs, tapes and like-type electrical interconnections.

Analogous to the stretchable carrier 400 of FIGS. 4A, 4B, and 5A-5C, the stretchable PV device 600 includes or is formed from one or more materials that allow one or more of the five stretchable-part length $406_1 \ldots 406_5$ to change responsive to one or more of the applied forces applied to the stretchable PV device 600 or elements thereof.

FIGS. 7A and 7B are simplified plan view diagrams illustrating an example stretchable PV device 700. The stretchable PV device 700 includes the stretchable carrier 400 (FIG. 4) and four PV cells $702_1 \ldots 702_4$. Each of the PV cells $702_1 \ldots 702_4$ is similar to the PV cell 202 of FIG. 2A, except as described herein.

The PV cells $702_1 \ldots 702_4$ may be disposed onto the mounting-site-upper surfaces $408_1 \ldots 408_4$, respectively, such that the entire or substantially all of the back-contact layers of PV cells $702_1 \ldots 702_4$ affix to such surfaces and conform to the form of the four mounting sites $402_1 \ldots 402_4$. Alternatively, the PV cells $702_1 \ldots 702_4$ may be disposed onto the mounting-site-upper surfaces $408_1 \ldots 408_4$, respectively, such that the back-contact layers of PV cells $702_1 \ldots 702_4$ affix to such surfaces only at certain locations and with or without conforming to the forms of the four mounting sites $402_1 \ldots 402_4$. This way, the PV cells $702_1 \ldots 702_4$ and the four mounting sites $402_1 \ldots 402_4$ may flex and/or bend at different rates, and/or within different limits of permissible flexing or bending.

In addition, one or more of the electrical conductors of the PV cells $702_1 \ldots 702_4$ may couple to the mounting-site contacts of the four mounting sites $402_1 \ldots 402$. The electrical conductors of the PV cells $702_1 \ldots 702_4$ may also couple to the electrically-conductive portions of the five stretchable parts $404_1 \ldots 404_5$ via the interconnection paths or via in direct coupling.

As above, the stretchable PV device 700 may include one or more buffer layers between the each of the PV cells $702_1 \ldots 702_4$ and the four mounting sites $402_1 \ldots 402_4$ to facilitate reduction of stresses and/or strains due to the PV cells $702_1 \ldots 702_4$ and the four mounting sites $402_1 \ldots 402_4$ having different rates of elongation and/or compression, and/or having different limits of elongation and/or compression. And depending on desired orientation of each of the PV cells $702_1 \ldots 702_4$ and/or application, layers other than the back-contact layer of such cells may be disposed onto or over the mounting-site-upper surfaces $408_1 \ldots 408_4$.

Like the stretchable PV device 600, the stretchable PV device 700 may be formed monolithically or hybridily. Under monolithic formation, the stretchable PV device 700 may be formed by (i) forming the stretchable carrier 400, (ii) depositing the PV cells $702_1 \ldots 702_4$ onto or over the four mounting sites $402_1 \ldots 402_4$, and then (iii) carrying out appropriate post-deposition processes (e.g., using any of mechanical and laser scribing to monolithically interconnect the PV cells $702_1 \ldots 702_4$).

Under hybrid formation, the stretchable PV device 700 may be formed by forming the stretchable carrier 400 separately from the PV cells $702_1 \ldots 702_4$ using separate processes. Thereafter, the PV cells $702_1 \ldots 702_4$ may be affixed onto or over the four mounting sites $402_1 \ldots 402_4$ using a bonding agent or adhesive. After the PV cells $702_1 \ldots 702_4$ become affixed to the stretchable carrier 400, appropriate post-affixing processes may be carried out. For example, the PV cells $702_1 \ldots 702_4$ may be interconnected using any of wire bonds, corrugated tabs, tapes and like-type electrical interconnections.

Analogous to the carrier 400 of FIGS. 4A, 4B, and 5A-5C, the stretchable PV device 700 includes or is formed from one or more materials that allow one or more of the five stretchable-part length $406_1 \ldots 406_5$ to change responsive to one or more of the applied forces applied to the stretchable PV device 700 or elements thereof.

Figure 8:
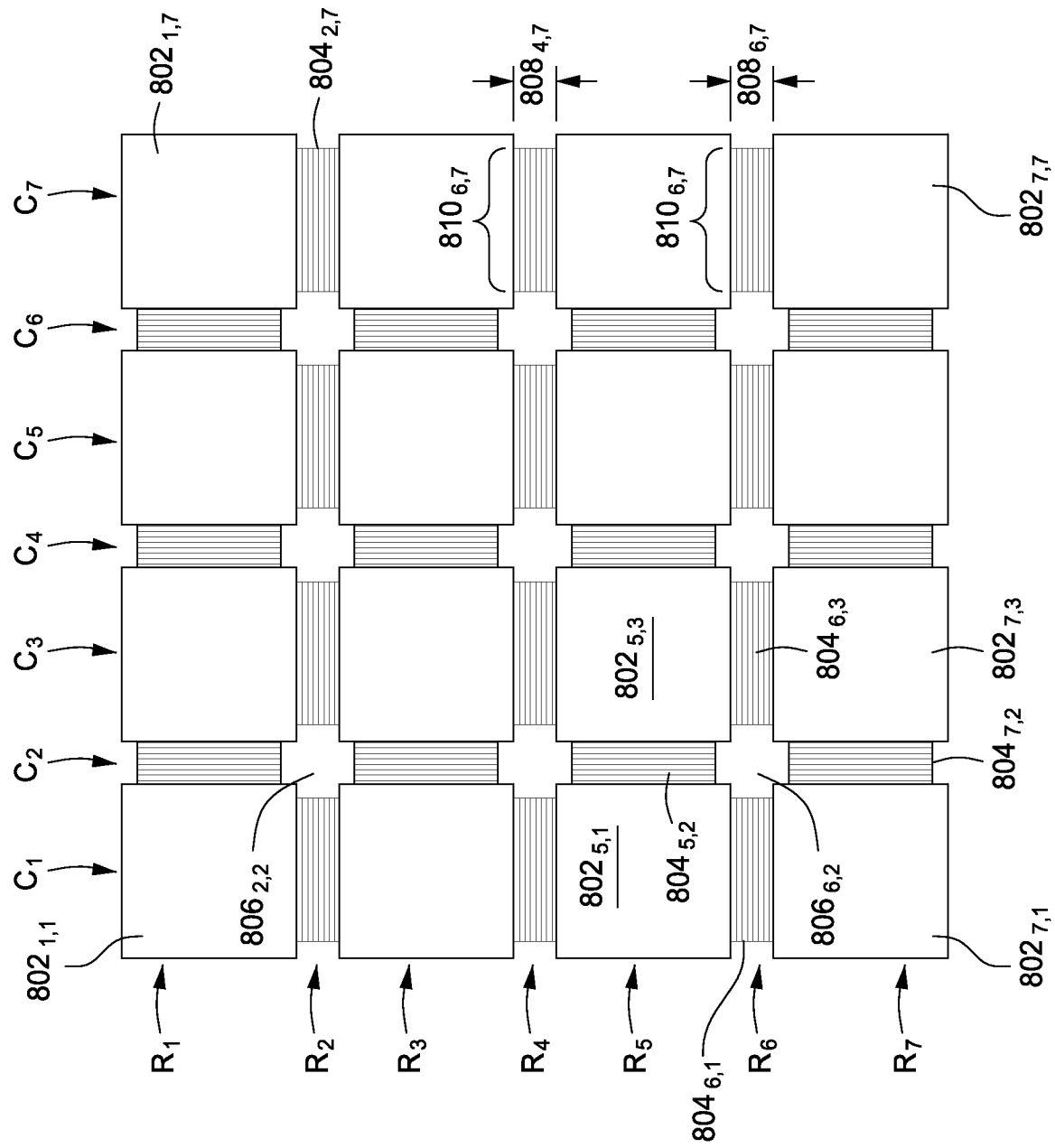
FIG. 8 is a simplified plan view diagram illustrating an example carrier for facilitating formation of any of a stretchable photovoltaic device and stretchable photovoltaic module.

FIG. 8 is a simplified plan view diagram illustrating an example stretchable carrier 800 for facilitating formation of any of a stretchable PV device and stretchable PV module. The carrier 800 is arranged into an array of rows r, where r=1-7 and columns c, where c=1-7, and includes stretchable parts $804_{r,c}$ (where r+c is always odd), mounting sites $802_{r,c}$ (where each of r and c is always odd), and apertures $806_{r,c}$ (where each of r and c is always even). For avoidance of repetition and for the sake of simplicity, reference is made to FIG. 4 when describing the stretchable carrier 800 or elements thereof.

Each of the mounting sites $802_{r,c}$ has a construction similar to any one of the four mounting sites $402_1 \ldots 402_4$ (FIG. 4), and each functions similar to any of such four mounting sites $402_1 \ldots 402_4$. The mounting sites $802_{r,c}$, like the four mounting sites $402_1 \ldots 402_4$, define respective surface areas. These surface areas have respective geometries ("mounting-site geometries"); each of which may be any of a cross, square, circle, hexagon, triangle, trapezoid, tetragon, trapezium, deltoid, pentagon, rhomboid, polygon, etc.

Each of the stretchable parts $804_{r,c}$ has a construction similar to any one of the five stretchable parts $404_1 \ldots 404_5$, and each functions similar to any of the five stretchable parts $404_1 \ldots 404_5$. Like the five stretchable parts $404_1 \ldots 404_5$, the stretchable parts $804_{r,c}$ define respective stretchable-part lengths $808_{r,c}$. The stretchable parts $804_{r,c}$ also define respective widths ("stretchable-part widths") $810_{r,c}$. These stretchable-part widths $810_{r,c}$ are generally transverse to the stretchable-part lengths $808_{r,c}$, and have respective geometries ("stretchable-part-width geometries") to adapt or otherwise conform to the mounting-site geometries. Alternatively, the stretchable-part-width geometries and/or the mounting-site geometries may take particular forms to accommodate various geometries of PV cells; various rates of flexion, elongation, compression, etc.; various desired form factors; and/or various applications.

Like the mounting sites $802_{r,c}$, the nine apertures $806_{r,c}$ define respective geometries ("aperture geometries"); each of which may be any of a cross, square, rectangle, circle, hexagon, triangle, trapezoid, tetragon, trapezium, deltoid, pentagon, rhomboid, octagon, etc. The aperture geometries, the stretchable-part-width geometries and/or the mounting-site geometries may take particular forms to accommodate various geometries of PV cells; various rates of flexion, elongation, compression, etc.; various desired form factors of the carrier 800; and/or various applications. Additionally and/or alternatively, the aperture geometries may take particular forms to allow electromagnetic radiation to pass through the carrier 800 (or a PV device or module incorporating such stretchable carrier 800) as described in more detail below.

Although shown as including twenty-four stretchable parts, sixteen mounting sites, and nine apertures, the stretchable carrier 800 may include more or fewer stretchable parts, mounting sites and/or apertures. And although the stretchable carrier 800 is shown as a square array, the stretchable carrier 800 may have a different geometry.

Figure 9:
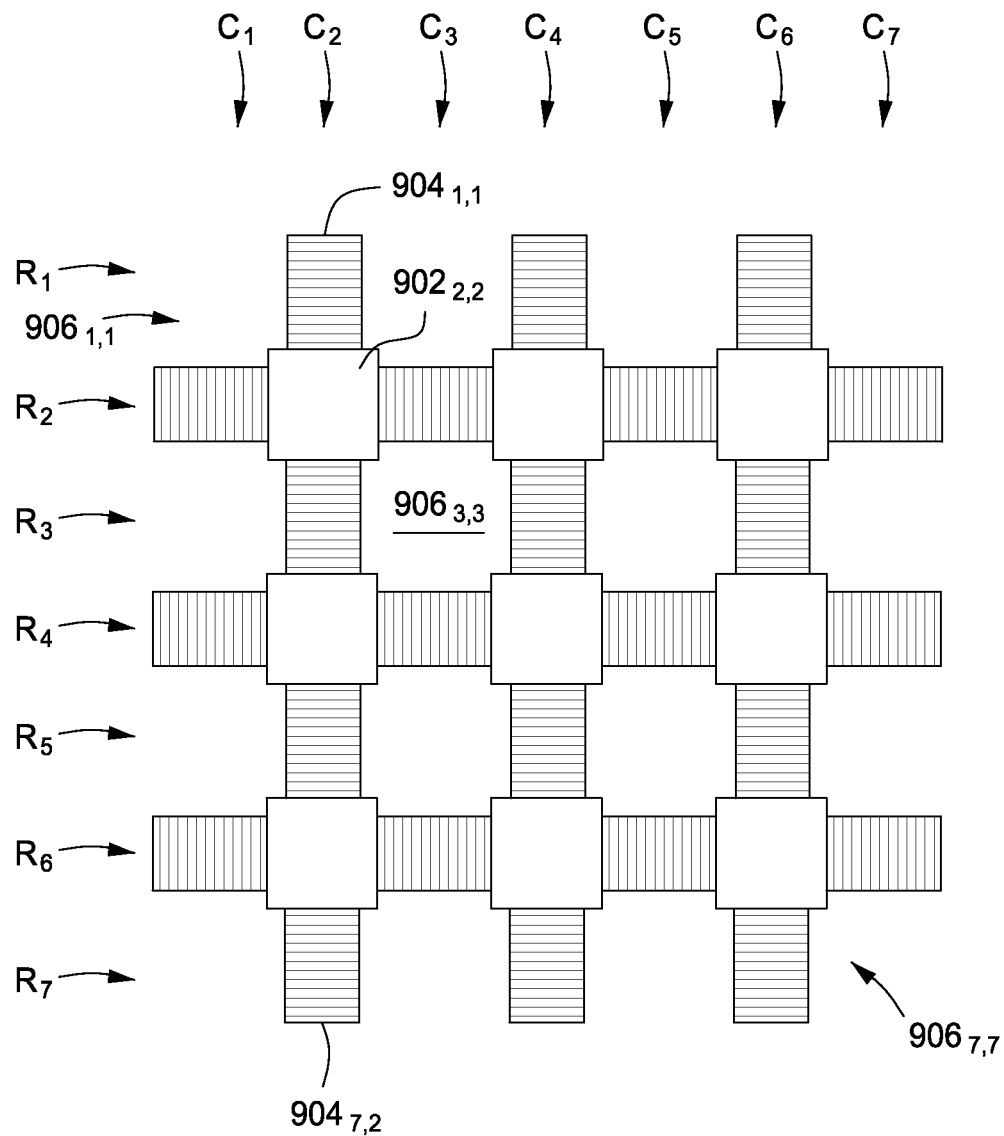
FIG. 9 is a simplified plan view diagram illustrating an example carrier for facilitating formation of any of a stretchable photovoltaic device and stretchable photovoltaic module.

Referring now to FIG. 9, simplified plan view diagrams illustrating an example stretchable carrier 900 for facilitating formation of any of a stretchable PV device and stretchable PV module is shown. Like the stretchable carrier 800 of FIG. 8, the stretchable carrier 900 is arranged into an array of rows r, where r=1-7, and columns c, where c=1-7; and includes twenty-four stretchable parts, namely, stretchable parts $904_{r,c}$, which are positioned in the same rows and columns as the stretchable parts (i.e., where r+c is always odd). The stretchable carrier 900 differs from the stretchable carrier 800 of FIG. 8 in that the stretchable carrier 900 has (i) apertures, namely, apertures $906_{r,c}$ positioned in the same rows and columns as the mounting sites $802_{r,c}$ (i.e., where each of r and c is always odd); and (ii) mounting sites, namely, mounting sites $902_{r,c}$ positioned in the same rows and columns as the apertures $806_{r,c}$ (i.e., where each of r and c is always odd).

The mounting sites $902_{r,c}$ have constructions and function similar to the mounting sites $802_{r,c}$. The stretchable parts $904_{r,c}$ have constructions and function similar to the stretchable parts $804_{r,c}$. The apertures $906_{r,c}$ have constructions similar to the apertures $806_{r,c}$.

Like the stretchable carrier 800, the aperture geometries of the apertures $906_{r,c}$, the stretchable-part-width geometries of the stretchable parts $904_{r,c}$ and/or the mounting-site geometries of the mounting sites $902_{r,c}$ may take particular forms to accommodate various geometries of PV cells; various rates of flexion, elongation, compression, etc.; various desired form factors of the stretchable carrier 900 (or a PV device or module incorporating such carrier 900); and/or various applications. Additionally and/or alternatively, the aperture geometries of the apertures $906_{r,c}$ may take particular forms to allow electromagnetic radiation to pass through the stretchable carrier 900 (or a PV device or module incorporating such carrier 900) as described in more detail below.

Although shown as including twenty-four stretchable parts, nine mounting sites, and sixteen apertures, the stretchable carrier 900 may include more or fewer stretchable parts, mounting sites and/or apertures. And although the stretchable carrier 900 is shown as a square array in which the stretchable parts are orthogonally positioned, the stretchable carrier 900 may have a different geometry and the stretchable parts may be positioned orthogonally or otherwise.

In some embodiments, a stretchable carrier may be constructed from either a single flexible film or foil, or from multiple foils, which may be electrically insulating or conducting depending on the electrical interconnection scheme, as illustrated below. Stretchable and mounting parts of the carrier may be manufactured and formed separately and subsequently assembled and attached to each other to produce a single carrier. For example, metal (e.g., stainless steel, copper, aluminum, etc.) foils may be machined to form corrugated stretchable parts of the carrier, whereas flat plastic (e.g., polyimide or the like) films may be used to produce mounting parts of the carrier. The stretchable parts may be attached to the mounting parts using conventional adhesives. It is to be understood that other sheet materials may be used to produce similar carriers and also alternative carrier geometries may be utilized.

Alternatively, a stretchable carrier can be constructed entirely or partially using wires, fibers, or grids and meshes of wires or fibers. For example, FIG. 25 depicts a stretchable carrier 2500 formed entirely of a wire mesh 2501 according to some embodiments of the invention. The wire mesh 2501 includes stretchable parts 2502 (e.g., corrugated parts) and mounting parts 2504. The wires of the wire mesh 2501 may be cut and formed using a single copper wire roll, for example. The corrugations in the stretchable parts 2502 may be produced parallel to the plane of the carrier 2500, rather than orthogonally to the plane of the carrier 2500. Separate wire sections in the wire mesh 2501 (i.e., stretchable parts 2502 or mounting parts 2504) may be welded, soldered, or otherwise bonded together to produce a single carrier. Stretchable parts 2502 and mounting parts 2504 may be made of different wires or different materials.

Figure 10A:
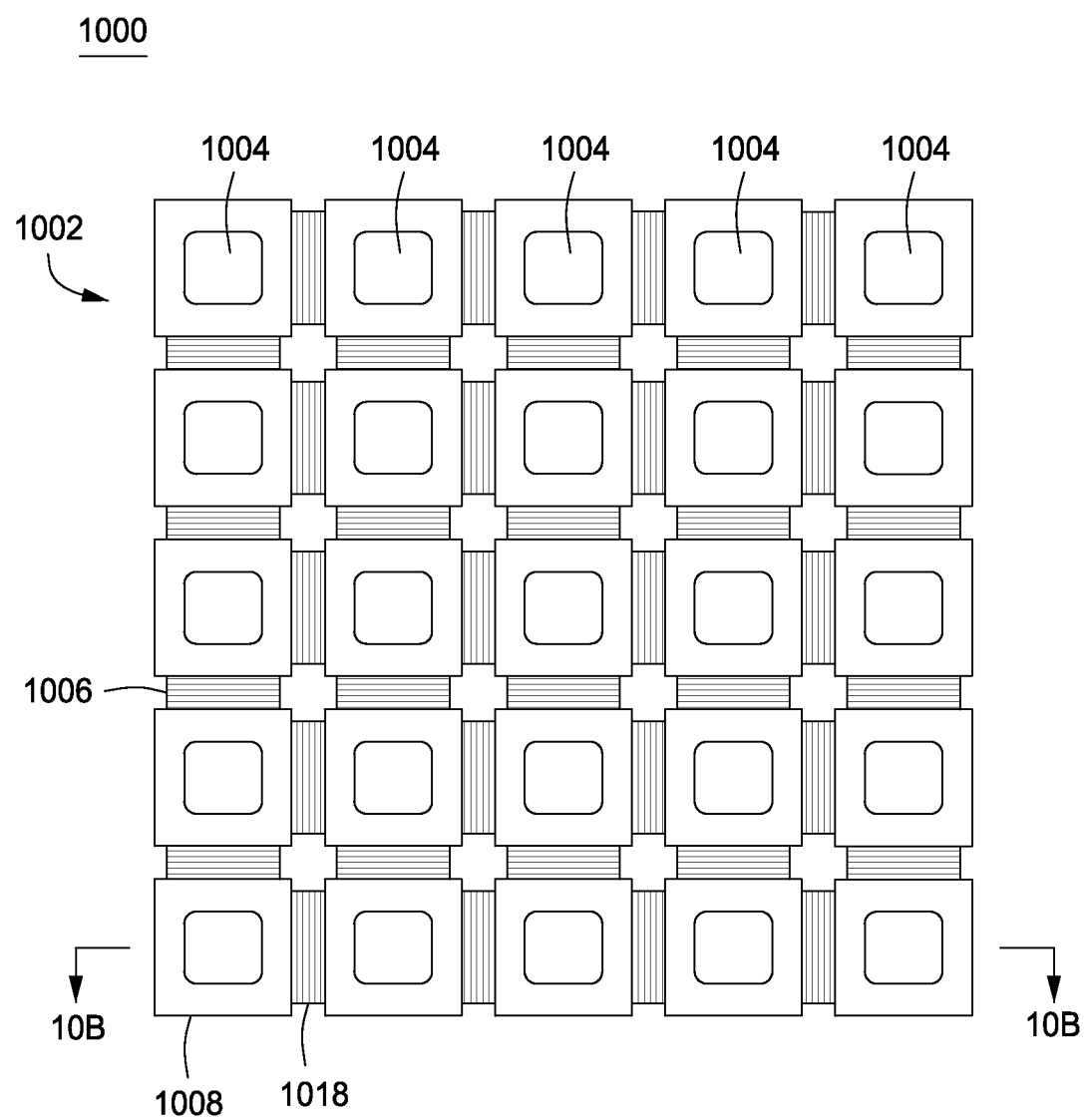
FIGS. 10A-10B are simplified plan view diagrams illustrating an example stretchable photovoltaic device.
Figure 10B:
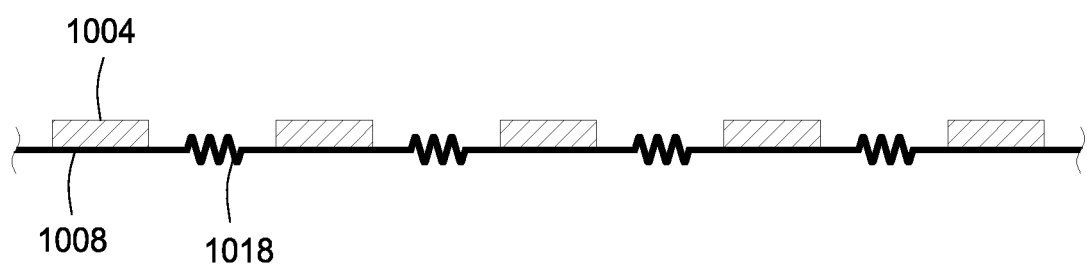

FIGS. 10A-10B are simplified plan view diagrams illustrating an example stretchable PV device 1000. The stretchable PV device 1000 includes a stretchable carrier 1002 and a plurality of PV cells 1004. For avoidance of repetition and for ease of simplicity, the stretchable PV device 1000 may be described with reference to the architectures of the stretchable carrier 800 of FIG. 8 and the PV device 700 of FIGS. 7A and 7B. The stretchable PV device 1000 may be implemented in other ways as well.

The stretchable carrier 800, as described above, defines two-dimensional positions for the stretchable parts $804_{r,c}$ mounting sites $802_{r,c}$ and apertures $806_{r,c}$. These positions define a first pattern ("pattern A"). As shown in FIG. 8, this pattern A defines that (i) the positions of the stretchable parts $804_{r,c}$ are located at row and column combinations where r+c is always odd, (ii) the positions of the mounting sites $802_{r,c}$ are located at row and column combinations where each of r and c is always odd, and (iii) the positions of the apertures $806_{r,c}$ are located at row and column combinations where each of r and c is always even.

The stretchable carrier 1002, like the stretchable carrier 800, includes respective pluralities of stretchable parts 1006, mounting sites 1008 and apertures 1010. These pluralities of stretchable parts 1006, mounting sites 1008 and apertures 1010 are arranged according to the pattern A. And like the PV device 700, the plurality of PV cells 1002 may be disposed over the mounting sites 1008.

The stretchable PV device 1000 includes or is formed from one or more materials that allow one or more of the stretchable-part lengths of the stretchable parts 1006 to change responsive to one or more of the applied forces applied to the stretchable PV device 1000 or elements thereof. In addition, the stretchable PV device 1000 may be formed monolithically or hybridily.

Figure 11A:
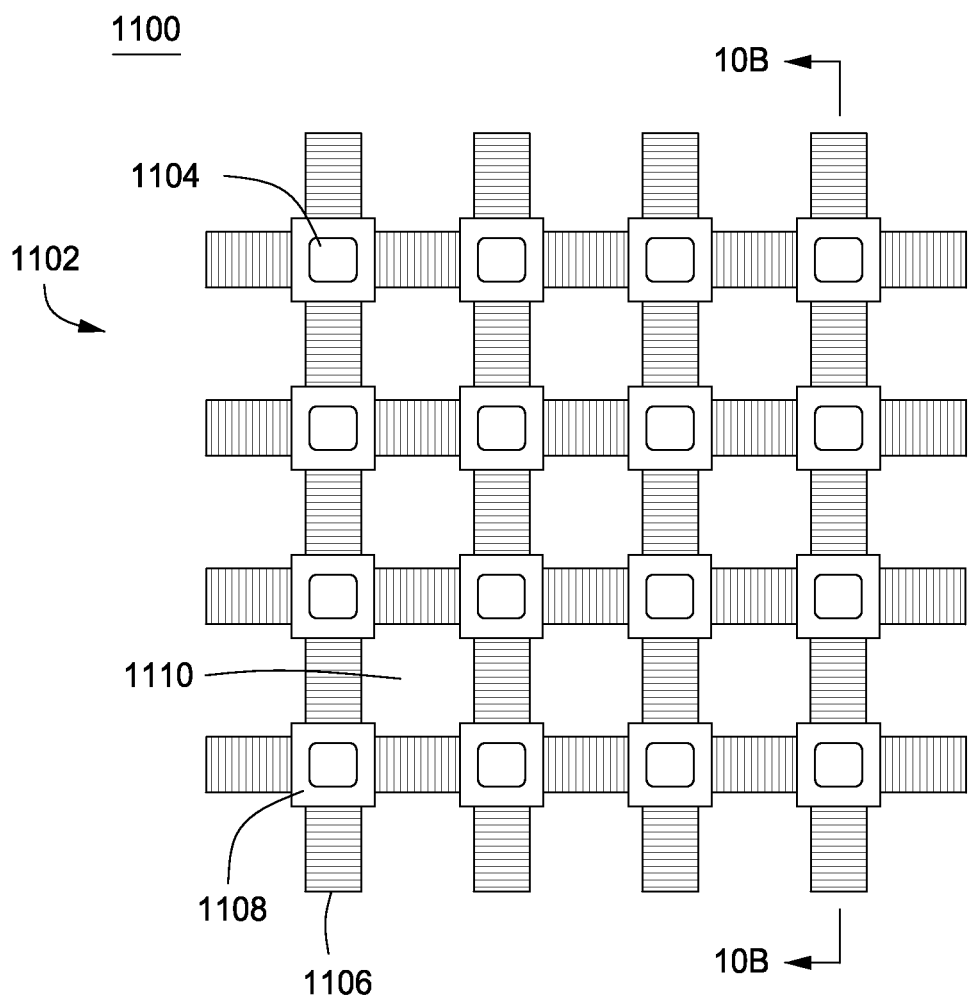
FIGS. 11A-11B are simplified plan view diagrams illustrating an example stretchable photovoltaic device.
Figure 11B:
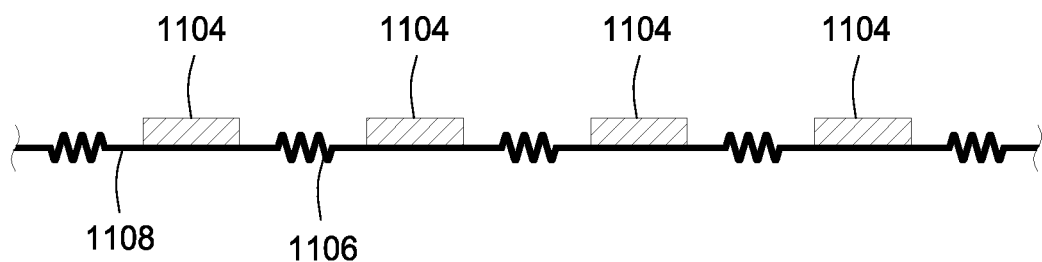

FIGS. 11A-11B are simplified plan view diagrams illustrating an example stretchable PV device 1100. The stretchable PV device 1100 includes a stretchable carrier 1102 and a plurality of PV cells 1104. For avoidance of repetition and for ease of simplicity, the stretchable PV device 1100 may be described with reference to the architectures of the stretchable carrier 900 of FIG. 9 and the PV device 700 of FIGS. 7A and 7B. The stretchable PV device 1100 may be implemented in other ways as well.

The stretchable carrier 900, as described above, defines respective two-dimensional positions for the stretchable parts $904_{r,c}$ mounting sites $902_{r,c}$ and apertures $906_{r,c}$. These positions define a second pattern ("pattern B"). As shown in FIG. 9, the pattern B defines that (i) the positions of the stretchable parts $904_{r,c}$ are located at row and column combinations where r+c is always odd, (ii) the positions of the mounting sites $902_{r,c}$ are located at row and column combinations where each of r and c is always even, and (iii) the positions of the apertures $906_{r,c}$ are located at row and column combinations where each of r and c is always odd.

The stretchable carrier 1100, like the stretchable carrier 900, includes pluralities of stretchable parts 1106, mounting sites 1108 and apertures 1110. These pluralities of stretchable parts 1106, mounting sites 1108 and apertures 1110 are arranged according to the pattern B. And like the PV device 700, the plurality of PV cells 1102 may be disposed over the mounting sites 1108.

The stretchable PV device 1100 includes or is formed from one or more materials that allow one or more of the stretchable-part lengths of the stretchable parts 1106 to change responsive to one or more of the applied forces applied to the stretchable PV device 1100 or elements thereof. Additionally, the stretchable PV device 1110 may be formed monolithically or hybridly.

FIG. 26 depicts a stretchable carrier 2600 and a plurality of PV cells 2602 according to some embodiments of the invention. The PV cells 2602 may be mounted and attached to mounting sites 2604 of the stretchable carrier 2600 using optional mounts 2606. The size of the PV cells 2602 may be larger than the size of the mounting sites 2604. Conducting sections of the stretchable carrier 2600 may be used for electrical interconnection between different ones of the PV cells 2602 either in parallel or in series, substantially as described above. Additional elements may be used the present device to improve its performance. For example, additional rigid elements (e.g., square brackets) may be used to strengthen the mounting sites 2604 of the device and protect the PV cells 2602 from potential damage due to uncompensated stress.

Figure 12A:
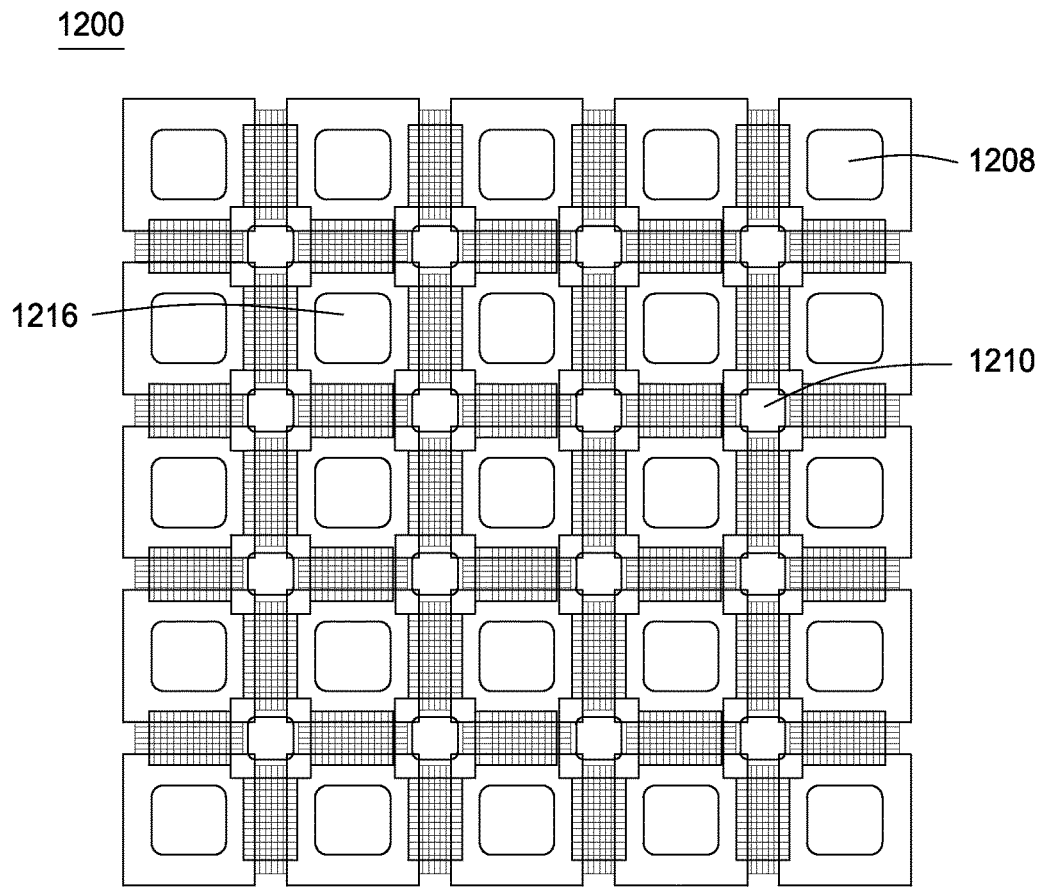
FIGS. 12A-12B are simplified plan view diagrams illustrating an example stretchable photovoltaic module.
Figure 12B:
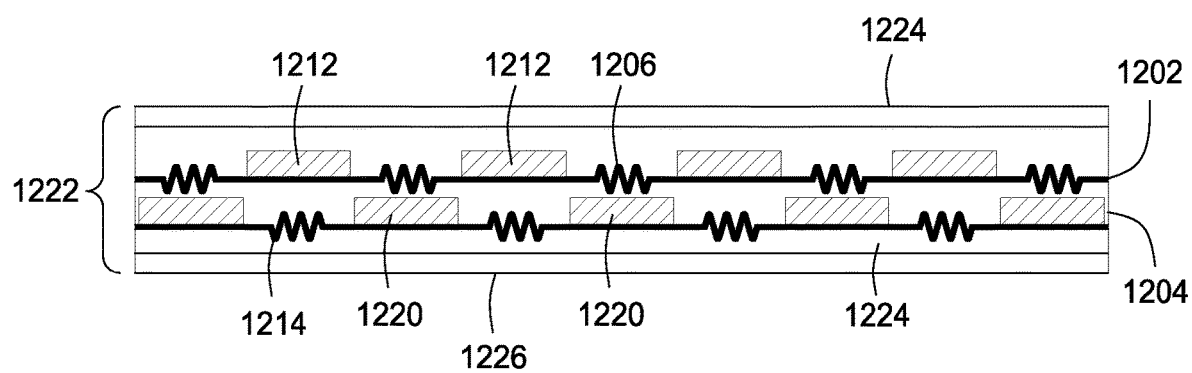

Referring now to FIGS. 12A-12B, simplified plan view diagrams illustrating an example stretchable PV module 1200 are shown. The stretchable PV module 1200 includes a first stretchable device 1202 overlaying a second stretchable device 1204. For avoidance of repetition and for ease of simplicity, the stretchable PV module 1200 may be described with reference to the architectures of the stretchable devices 1000, 1100 of FIGS. 10A-10B and 11A-11B, respectively.

The first stretchable device 1202 has a construction similar to and also functions similar to the stretchable device 1000 of FIGS. 10A-10B. In addition, the first stretchable device 1202 includes respective pluralities of stretchable parts 1206, mounting sites 1208 and apertures 1210 arranged according to the pattern A. The first stretchable device 1202 also includes a plurality of PV cells 1212 disposed over the mounting sites 1208.

The second stretchable device 1204 has a construction similar to and also functions similar to the stretchable device 1100 of FIGS. 11A-11B. The second stretchable device 1204 includes respective pluralities of stretchable parts 1214, mounting sites 1216 and apertures 1218 arranged according to the pattern B. In addition, the second stretchable device 1204 includes a plurality of PV cells 1220 disposed over the mounting sites 1216.

The first stretchable device 1202 may overlay the second stretchable device 1204 so as to align the first-stretchable-device apertures 1210 over the second-stretchable-device PV cells 1220, and/or align second-stretchable-device apertures 1218 over the first-stretchable-device PV cells 1212. By aligning this way, electromagnetic radiation may pass through the first-stretchable-device apertures 1210 to the second-stretchable-device PV cells 1220 This combination allows for an effective active PV area or aperture greater than would be available by having only a single stretchable device.

The stretchable PV module 1200 may also include an encapsulation 1222. The encapsulation 1222 that encapsulates the first and second stretchable devices 1202, 1204. The encapsulation 1222 includes first and second coversheets 1224, 1226 separated by a layer of encapsulating material 1228; each of which may be constructed similar to and function similar to like-type elements of the encapsulation 302 of FIG. 3.

As shown, the encapsulation 1222 entirely encapsulates the first and second stretchable devices 1202, 1204. The encapsulation 1222, however, may only encapsulate a portion of the first and second stretchable devices 1202, 1204. In addition, the first stretchable device 1202 is shown as overlaying the second stretchable device 1204, the stretchable PV module 1200 may also be formed with the second stretchable device 1204 overlaying the first stretchable device 1202.

Figure 13:
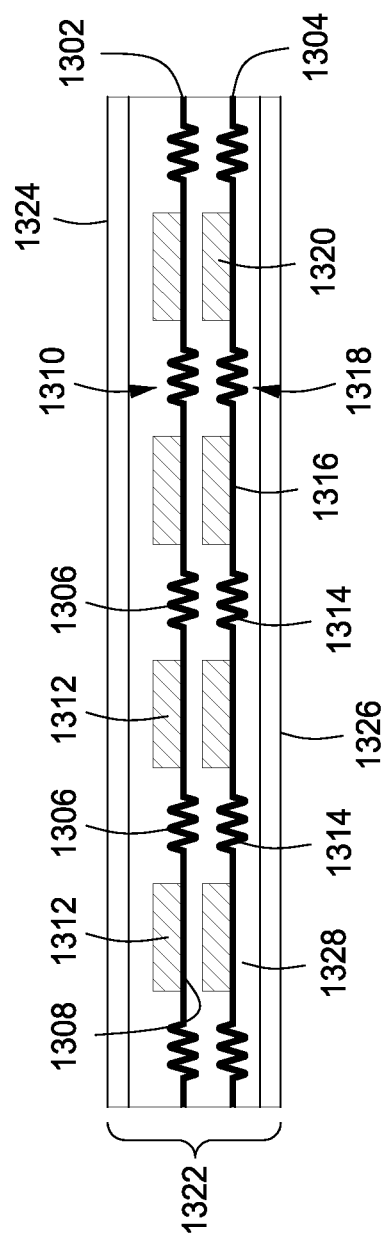
FIG. 13 is a simplified plan view diagram illustrating an example stretchable photovoltaic module.

FIG. 13 is a simplified plan view diagram illustrating an example stretchable PV module 1300. The stretchable PV module 1300 includes a first stretchable device 1302 overlaying a second stretchable device 1304. For avoidance of repetition and for ease of simplicity, the stretchable PV module 1300 may be described with reference to the architectures of the stretchable devices 1000, 1100 of FIGS. 10A-10B and 11A-11B, respectively.

The first stretchable device 1302 has a construction similar to, and also functions similar to the stretchable device 1000 of FIGS. 10A-10B. In addition, the first stretchable device 1302 includes respective pluralities of stretchable parts 1306, mounting sites 1308 and apertures 1310 arranged according to the pattern A. The first stretchable device 1302 also includes a plurality of PV cells 1312 disposed over the mounting sites 1308. The first-stretchable-device PV cells 1312 and the mounting sites 1308 may be at least partially transparent. This way, some fraction of electromagnetic radiation unabsorbed by the first-stretchable-device PV cells 1312 may pass thorough them and the mounting sites 1308. The first-stretchable-device PV cells 1312 may be, for example, single-junction PV cells having a semiconductor absorber with a characteristic bandgap $E_1$ in the range of 1.4 to 2.4 eV. By way of example, the first-stretchable-device PV cells 1312 may be fabricated from CGS ($CuGaSe_2$) so as to exhibit a 1.7 eV bandgap.

Like the first stretchable device 1302, the second stretchable device 1304 has a construction similar to, and also functions similar to the stretchable device 1000 of FIGS. 10A-10B. In addition, the second stretchable device 1304 includes respective pluralities of stretchable parts 1314, mounting sites 1316 and apertures 1318 arranged according to the pattern A. The second stretchable device 1304 also includes a plurality of PV cells 1320 disposed over the mounting sites 1316. The first-stretchable-device PV cells 1312 may be, for example, single-junction PV cells having a semiconductor absorber with a characteristic bandgap $E_2$ in the range of 0.6 to 1.8 eV, so that $E_2<E_1$. The second-stretchable-device PV cells 1320 may be fabricated from CIS ($CuInSe_2$) so as to exhibit a 1.0 eV bandgap.

The first stretchable device 1302 may overlay the second stretchable device 1304 so as to align, at least in part, the first-stretchable-device PV cells 1312 over the second-stretchable-device PV cells 1320. By aligning this way, electromagnetic radiation may pass through the first-stretchable-device PV cells 1312 to the second-stretchable-device PV cells 1320, which may allow the stretchable PV module 1300 to function similar to known multi-junction PV devices and/or have a higher efficiency than having a single junction stretchable-device.

In addition, the stretchable PV module 1300 may also include an encapsulation 1322. The encapsulation 1322 that encapsulates the first and second stretchable devices 1302, 1304. The encapsulation 1322 includes first and second coversheets 1324, 1326 separated by a layer of encapsulating material 1328; each of which may be constructed similar to and function similar to like-type elements of the encapsulation 302 of FIG. 3.

As shown, the encapsulation 1322 entirely encapsulates the first and second stretchable devices 1302, 1304. The encapsulation 1322, however, may only encapsulate a portion of the first and second stretchable devices 1302, 1304.

As described, the first and second stretchable devices 1302, 1304 are similar to the stretchable device 1000 of FIG.

10. The first and second stretchable devices 1302, 1304 may take other forms as well. For example, the first and second stretchable devices 1302, 1304 may be similar to the stretchable device 1100 of FIG. 11.

Referring now to FIG. 14, a simplified plan view diagram illustrating an example stretchable PV device 1400 is shown. The stretchable PV device 1400 includes a stretchable carrier 1402, a plurality of pedestals 1404, and a plurality of PV cells 1406.

The stretchable carrier 1402 is similar to any of the aforementioned stretchable carriers, and includes pluralities of stretchable parts 1408, mounting sites 1410, and optionally, apertures (not shown). The plurality of pedestals 1404 may be disposed onto or over the mounting sites 1410, and the plurality of PV cells 1406 may be disposed onto or over the plurality of pedestals 1404.

Each of the plurality of pedestals 1404 may define dimensions that cause the PV cells 1406 to be positioned sufficiently above the stretchable carrier 1402 to define an effective active PV area or aperture 1412 greater than would be available by disposing the PV cells 1406 within the confines of the surfaces areas of the mounting sites 1410. The plurality of pedestals 1404 and the plurality of PV cells 1406 may be dimensioned to allow, with respect to desired flexing, elongation and/or compression, minimum spacing between adjacent PV cells 1406.

In addition to or in lieu of the plurality of pedestals 1404, the stretchable carrier 1402 may include additional substrates, heat sinks, submounts, or other like-type spacers. These spacers, like the plurality of pedestals 1404, may provide an effective active PV area or aperture 1412 greater than would be available by disposing the PV cells 1406 within the confines of the surfaces areas of the mounting sites 1410. In addition, the plurality of pedestals 1404 and/or submounts may be electrically conductive, and may provide electrical connectivity among the PV cells 1406, mounting-site contacts of the mounting sites 1410 and/or positive and negative PV-cells terminals. The plurality of pedestals 1404 and/or submounts increase performance, e.g., device efficiency, and improve manufacturing process, e.g., yield of hybridly integrated stretchable PV devices.

FIG. 15 is a simplified plan view diagram illustrating an example stretchable PV device 1500. The stretchable PV device 1500 includes a stretchable carrier 1502 and a plurality of PV cells 1504.

The stretchable carrier 1502 is similar to any of the aforementioned stretchable carriers, and includes pluralities of stretchable parts 1506, mounting sites 1508, and optionally, apertures (not shown). The mounting sites 1508 may include respective mounting-site contacts made from electrically conducting materials, such as metal foils, laminate films with metal foils or composite films with embedded conductors. As above, these mounting-site contacts may electrically couple or interconnect to the front and back contacts of PV cells 1504. The mounting sites 1508 may also include electrically insulating portions for providing electrical separation and insulation between different contacts and terminals.

The stretchable parts 1506 may also include electrically conductive portions ("stretchable-part-conducting portions") made from the electrically conductive materials. The stretchable-part-conducting portions electrically couple or interconnect to the mounting-site contacts. Both positive and negative terminals of PV cells 1504 may be located on the cells' backside and have direct electrical connection to the mounting-site contacts.

The stretchable-part-conducting portions, mounting-site contacts and/or front and back contacts of PV cells 1504 may be arranged to interconnect the outputs of the PV cells 1504 in series or in parallel. In the former, the stretchable-part-conducting portions, mounting-site contacts and/or front and back contacts of PV cells 1504 may interconnect so that positive terminals (e.g., back contacts) of the PV cells 1504 are connected to negative terminals (e.g., front contacts) of the PV cells 1504. In the latter, stretchable-part-conducting portions, mounting-site contacts and/or the front and back contacts of PV cells 1504 may interconnect so that the positive terminals of the PV cells 1504 are interconnected, and the negative terminals of the PV cells 1504 interconnected.

FIG. 16 is a simplified plan view diagram illustrating an example stretchable PV device 1600. The stretchable PV device 1600 includes a stretchable carrier 1602, a plurality of PV cells 1604 and connectors 1612.

The stretchable carrier 1602 is similar to any of the aforementioned stretchable carriers, and includes pluralities of stretchable parts 1606, mounting sites 1608, and optionally, apertures (not shown). The mounting sites 1608 may include mounting-site contacts that electrically couple or interconnect to the back contacts of PV cells 1604. In addition, the stretchable parts 1606 may include stretchable-part-conducting portions that electrically couple or interconnect to the mounting-site contacts.

The connectors 1612 may be made, at least in part, from electrically conducting materials, and electrically couple or interconnect to the front contacts of PV cells 1604. The connectors 1612 may be flexible and stretchable; and may be any of wire-bonded wires, corrugated tabs, tapes and the like.

The stretchable-part-conducting portions, mounting-site contacts, front and back contacts of PV cells 1604 and/or connectors may be arranged to interconnect outputs of the PV cells 1604 in series or in parallel. In the former, the stretchable-part-conducting portions, mounting-site contacts and/or the front and back contacts of PV cells 1604 may interconnect so that positive terminals (e.g., back contacts) of the PV cells 1604 are connected to negative terminals (e.g., front contacts) of the PV cells 1604. In the latter, stretchable-part-conducting portions, mounting-site contacts and/or the front and back contacts of PV cells 1604 may interconnect so that the positive terminals of the PV cells 1604 interconnect, and the negative terminals of the PV cells 1604 interconnect.

FIGS. 17A and 17B are simplified plan view diagrams illustrating an example stretchable PV device 1700. The stretchable PV device 1700 includes a stretchable carrier 1702, a plurality of PV cells 1704, first and second pluralities of mounting-site contacts 1706, 1707 and first and second busbars 1708, 1710. For avoidance of repetition and for ease of simplicity, the stretchable PV device 1700 may be described with reference to the architectures of the stretchable devices 1000, 1600 of FIGS. 10A-10B and FIG. 16, respectively.

The stretchable carrier 1702, like the stretchable carrier 1002, includes respective pluralities of stretchable parts 1712, mounting sites 1714 and apertures 1716. Like the PV device 1000, the plurality of PV cells 1704 may be disposed onto or over the mounting sites 1714.

The stretchable PV device 1700 includes or is formed from one or more materials that allow one or more of the stretchable-part lengths of the stretchable parts 1712 to change responsive to one or more of the applied forces applied to the stretchable PV device 1700 or elements thereof. In addition, the stretchable PV device 1700 may be formed monolithically or hybridly.

First and second pluralities of mounting-site connectors 1706, 1707 have constructions similar to, and function similar to the connectors 1612 shown in FIG. 16. The first plurality of mounting-site connectors 1706, in general, couple the positive terminals of the PV cells 1704 ("PV-cells-positive terminals") to the first busbar 1708; and the second plurality of mounting-site connectors 1707, in general, couple the negative terminals of the PV cells 1704 ("PV-cells-negative terminals") to the second busbar 1710. The connectors 1612 may be flexible and stretchable; and may be any of wire-bonded wires, corrugated tabs, tapes and the like.

The first and second busbars 1708, 1710 are electrically conductive and interconnect outputs of the PV cells 1704 in parallel. To facilitate this, the first busbar 1708 includes a plurality of interconnection bars ("first-interconnecting bars") 1718 electrically interconnected to a termination bar ("first-terminating bar") 1720; and the second busbar 1710 includes a plurality of interconnection bars ("second-interconnecting bars") 1722 electrically interconnected to a termination bar ("second-terminating bar") 1724. Each of the first-interconnecting bars 1718, first-terminating bar 1720, second-interconnecting bars 1722 and second-terminating bar 1724 is electrically conductive, and may include or be made from electrically conductive materials, such as any of metals and conductive polymers.

To facilitate interconnection, the first plurality of connectors 1706 interconnect with the first-interconnecting bars 1718, which interconnects with the first-terminating bar 1720. In addition, the second plurality of connectors 1707 interconnect with the second-interconnecting bars 1722, and in turn, the first-interconnecting bars 1722 interconnect with the second-terminating bar 1724.

Under hybrid formation, the first and second busbars 1708, 1710 may be deposited using, for example, by ink-jet or screen printing. Under monolithic formation, the first and second busbars 1708, 1710 may be deposited using deposition processes for thin-film materials. Under either formation, the first and second busbars 1708, 1710 may be deposited or otherwise disposed so that they are conformal with or otherwise formed over the stretchable parts 1712 and mounting sites 1714 (and optionally, the apertures 1716). In addition, the materials of and the form of the first and second busbars 1708, 1710 allow the first and second busbars 1708, 1710 to change in accordance with the stretchable-path lengths of the stretchable device 1700.

FIGS. 18A and 18B are simplified plan view diagrams illustrating an example stretchable PV device 1800. The stretchable PV device 1800 includes a stretchable carrier 1802, a plurality of PV cells 1804, first and second pluralities of mounting-site connectors 1806, 1808 and a plurality busbars 1810. For avoidance of repetition and for ease of simplicity, the stretchable PV device 1800 may be described with reference to the architectures of the stretchable devices 1000, 1600 of FIGS. 10A-10B and FIG. 16, respectively.

The stretchable carrier 1802, like the stretchable carrier 1002, includes respective pluralities of stretchable parts 1812, mounting sites 1814 and apertures 1816. Like the PV device 1000, the plurality of PV cells 1804 may be disposed onto or over the mounting sites 1814.

The stretchable PV device 1800 includes or is formed from one or more materials that allow one or more of the stretchable-part lengths of the stretchable parts 1812 to change responsive to one or more of the applied forces applied to the stretchable PV device 1800 or elements thereof. In addition, the stretchable PV device 1800 may be formed monolithically or hybridly.

The busbars 1810 facilitate a series interconnection of the outputs of the PV cells 1804. To facilitate such series interconnection, each of the busbars 1810 is electrically conductive, and may include or be made from electrically conductive materials, such as any of metals and conductive polymers.

The first and second pluralities of mounting-site connectors 1806, 1807 have constructions similar to, and function similar to the connectors 1612 shown in FIG. 16. The first plurality of mounting-site connectors 1806 couple the PV-cells-positive terminals of the PV cells 1804 to specific ones of the busbars 1810; and the second plurality of mounting-site connectors 1806 couple the PV-cells-negative terminals of the PV cells 1804 to specific ones of the busbars 1810. The connectors 1612 may be flexible and stretchable; and may be any of wire-bonded wires, corrugated tabs, tapes and the like. The first and second pluralities of mounting-site connectors 1806, 1807 are coupled to busbars 1810 such that each of the PV cells 1804 is serially coupled with an adjacent one of the PV cells 1804. The serial interconnection of the PV cells 1804 is shown by way of example as starting from the PV cell in the top left corner, proceeding across a row from left to row, proceeding down to the next row, proceeding across the next row from right to left, proceeding down to the next row, and so on until the PV cell in the bottom right corner. It is to be understood that other types of serial interconnections among the PV cells 1804 can be employed.

Under hybrid formation, the busbars 1810 may be deposited using, for example, by ink-jet or screen printing. Under monolithic formation, the busbars 1810 may be deposited using deposition processes for thin-film materials. Under either formation, the busbars 1810 may be deposited or otherwise disposed so that they are conformal with or otherwise formed over the stretchable parts 1812 and mounting sites 1814 (and optionally, the apertures 1816). In addition, the materials of and the form of the busbars 1810 allow the busbars 1810 to change in accordance with the stretchable-path lengths of the stretchable device 1800.

FIGS. 21 through 24 depict simplified plan view diagrams illustrating example stretchable PV device 2100 having different types of stretchable parts according to some embodiments of the invention. FIG. 21 shows a stretchable PV device 2100 having a stretchable carrier 2102 and a plurality of PV cells 2104. The stretchable carrier 2102 is similar to any of the aforementioned stretchable carriers, and includes pluralities of stretchable parts 2106, mounting sites 2108, and optionally, apertures (not shown). The stretchable PV device 2100 is similar to that shown in FIGS. 15 and 16. However, in the present example, the stretchable parts 2106 may be implemented as elastic bands, rather than corrugations. The elastic bands 2106 stretch in the plane of the stretchable carrier 2102 responsive to one or more applied forces.

FIG. 22 shows a stretchable PV device 2200 having the stretchable carrier 2202 and a plurality of PV cells 2204. The stretchable carrier 2202 is similar to any of the aforementioned stretchable carriers, and includes pluralities of stretchable parts 2206, mounting sites 2208, and optionally, apertures (not shown). However, in the present example, the stretchable parts 2206 may be implemented as hinges, rather than corrugations. The hinges 2206 stretch in the plane of the stretchable carrier 2202 responsive to one or more applied forces.

FIG. 23 shows a stretchable PV device 2300 having the stretchable carrier 2302 and a plurality of PV cells 2304. The stretchable carrier 2302 is similar to any of the aforementioned stretchable carriers, and includes pluralities of stretchable parts 2306, mounting sites 2308, and optionally, apertures (not shown). However, in the present example, the stretchable parts 2306 may be implemented as springs, rather than corrugations. The springs 2306 stretch in the plane of the stretchable carrier 2302 responsive to one or more applied forces.

FIG. 24 shows a stretchable PV device 2400 having the stretchable carrier 2402 and a plurality of PV cells 2404. The stretchable carrier 2402 is similar to any of the aforementioned stretchable carriers, and includes pluralities of stretchable parts 2406, mounting sites 2408, and optionally, apertures (not shown). However, in the present example, the stretchable parts 2406 may be implemented as rails, rather than corrugations. The rails 2406 stretch in the plane of the stretchable carrier 2402 responsive to one or more applied forces.

FIG. 19 is a flow diagram illustrating an example process 1900 for forming a stretchable photovoltaic device under monolithic formation. For avoidance of repetition and for ease of simplicity, the following describes the process 1900 with reference to the architecture of the stretchable device 400 of FIG. 4, first; and then, describes the process 1900 with reference to the architectures of the stretchable devices 1000, 1500, 1700 and 1800 of FIGS. 10A-10B, FIG. 15, FIG. 17 and FIG. 18, respectively, second. The process 1900 may be carried out using other architectures as well.

The flow 1900 starts at termination block 1902, and sometime thereafter, transitions to process block 1904. At the process block 1904, the process 1900 forms the stretchable carrier 102. To do this, the process 1900 may deposit one or more metals and/or plastics over a given form so as to form a foil in the form the corrugations $108_1 \ldots 108_n$. The process 1900 may deposit the metals using, for example, physical vapor deposition ("PVD"). The metals and plastics may include, for example, any of stainless steel, aluminum and copper, polyimide, polyethylene, ethylene vinyl acetate (EVA), and the like. The foil, and in turn, the stretchable carrier 102 may have an ultimate thickness between about 10 to 200 microns or between about 25 to 100 microns, although other thicknesses are possible.

After process block 1904, the process 1900 may transition to process block 1906. At the process block 1906, the process may form the PV cell 202 over the stretchable carrier 102. To form the PV cell 202, the process 1900 may deposit the thin-film materials noted above to form the PV stack 204. This may include the process 1900 using any of PVD, CVD, ALD and the like to deposit the PV-stack layers onto or over the foil of the stretchable carrier 102.

By way of example, the process 1900 may deposit the PV stack 204 in which the n-type and p-type semiconductor layers 206, 208 together are a single junction formed from GIGS ("CIGS junction"). To do this, the process 1900 may first deposit (e.g., by sputtering) a layer of molybdenum having a thickness between about 0.5-1 µm onto (or over) the metal foil of the stretchable carrier 102 so as to form the back-contact layer 212.

After depositing the back-contact layer 212, the process 1900 may form the CIGS junction. This may include the process 1900 depositing (e.g., by sputtering) a layer of CIGS, e.g. a layer of $CuIn_{0.3}Ga_{0.7}Se_2$, having an ultimate thickness of about 1-3 µm onto (or over) the back-contact layer 212. After depositing the CIGS junction, the process 1900 may deposit (e.g., by wet chemical bath deposition) a layer of cadmium sulfide ("CdS") having an ultimate thickness of about 30-100 nm. This CdS layer is a window layer to the CIGS junction, and as such, allows electromagnetic radiation to pass to the underlying CIGS junction.

After depositing the window layer, the process 1900 may deposit an optional buffer layer of undoped zinc oxide ("ZnO"). This buffer layer may protect the pn junction region from subsequent harsh processing steps, such as sputtering. Also, this layer may function as a transport barrier layer against minority carriers and thus improve device efficiency. In addition, this layer may reduce the shunt resistance of the device and also improve the device efficiency.

After depositing the buffer layer, the process 1900 may deposit (e.g., by sputtering) a layer of aluminum doped ZnO ("Al:ZnO") or, alternatively, a layer of indium oxide doped tin ($In_2O_3$:Sn or "ITO") as a transparent front-contact layer 210. After or during formation of the PV stack 204, the process 1900 may form the first and second conductors 209, 211 by appropriately depositing thin film material and/or forming vias in the PV stack 204 so as to permit interconnection with the front and back contact layers 210, 212, respectively.

Although the foregoing describes the process 1900 forming the PV stack 204 with only a single junction, the process 1900 may also carry out forming the PV stack 204 with more than one junction. To do this, for example, the process 1900 may deposit more and/or different layers than described above.

While the foregoing also describes the process 1900 as forming the PV stack 204 as a single PV cell, the process 1900 may also form the PV stack 204 with a plurality of PV cells. To facilitate this, the process 1900 at the process block 1906 may be modified to include one or more processes to form the plurality of PV cells. For example, the process 1900 may include a laser, mechanical or other type of scribing of the back-contact layer 212 to separate the back-contact layer 212 into a plurality of discrete back contacts. In addition, after formation of each of the GIGS, window, buffer, transparent front-contact layer 210, etc., the process 1900 may laser, mechanically or otherwise scribe each of such layers into discrete portions that match the shape and orientation of the discrete back contacts. These discrete portions form the plurality of PV cells.

After process block 1906, the process 1900 may transition to process block 1908. At the process block 1908, the process 1900 may interconnect the PV cell 202 to the output terminals of the PV device 200. To do this, the process 1900 may interconnect the first and second conductors 209, 211 to the first and second output terminals 205, 207, respectively. To facilitate such interconnection, the process 1900 may deposit metals to form wires between the first and second conductors 209, 211 to the first and second output terminals 205, 207, respectively. Alternatively, the process 1900 may wirebond wires or print conductive traces between (i) the first conductor 209 and the first output terminal 205, and/or (ii) the second conductors 211 and the second output terminal 207. Any combination of the foregoing is possible as well.

While the foregoing also describes the process 1900 as interconnecting a single PV cell, namely, PV cell 204, the process 1900 may also interconnect a plurality of PV cells in series and/or in parallel. To facilitate this, the process 1900 at the process block 1908 may be modified to include one or more processes to interconnect the plurality of PV cells. For example, the process 1900 may interconnect each of the plurality of PV cells by wirebonding wires or printing conductive traces, as appropriate, between the PV-cellspositive terminals, PV-cells-negative terminals, the first output terminal 205, and/or the second output terminal 207.

After process block 1908, the process 1900 may transition to termination block 1910. At the termination block 1910, the process 1900 ends. Alternatively, the process 1900 may be repeated periodically, in continuous fashion, or upon being triggered as a result of a condition.

Referring back to process block 1904 and with respect to the PV device 1000, the process 1900 may form the stretchable carrier 1002. To do this, the process 1900 may form the stretchable parts 1006 and mounting sites 1008 similar to forming the stretchable carrier 102 as described above. For example, the process 1900 may deposit one or more metals and/or plastics over a given form so as to form a foil in the form the stretchable parts 1006 and mounting sites 1008. The process 1900 may deposit the metals and/or plastics using, for example, PVD or CVD. The metals and plastics may include, for example, any of as stainless steel, aluminum and copper, polyimide, polyethylene, ethylene vinyl acetate (EVA), and the like. The foil, and in turn, the stretchable parts 1006 and mounting sites 1008 may have an ultimate thickness between about 10 to 200 microns or between about 25 to 100 microns.

In addition, the process 1900 may machine or otherwise remove the apertures 1010 from the foil. After process block 1904, the process 1900 may transition to process block 1906.

At the process block 1906, the process may form the plurality of PV cells 1004 over the stretchable parts 1006 and/or mounting sites 1008. To form the plurality of PV cells 1004, the process 1900 may deposit the thin-film materials noted above to form respective PV stacks. To do this, the process 1900 may use any of PVD, CVD, ALD and the like to deposit the PV-stack layers of each of the respective PV stacks onto or over the foil of the stretchable parts 1006 and mounting sites 1008. The process 1900 may do this in accordance with the example described above with respect to the PV stack 204.

After process block 1906, the process 1900 may transition to process block 1908. At the process block 1908, the process 1900 may interconnect the plurality of PV cells 1004 to the output terminals of the PV device 1000. To facilitate this, the process 1900 may appropriately interconnect the first and second conductors of each of the plurality of PV cells to form series or parallel interconnection. Then, the process 1900 may interconnect the interconnected PV cells to the output terminals 205, 207. To facilitate such interconnection, the process 1900 may deposit metals to form wires or alternatively wirebond wires or print conductive traces as described above with respect to the PV devices 1700, 1800 of FIGS. 17 and 18, respectively. Any combination of the foregoing is possible as well.

After process block 1908, the process 1900 may transition to termination block 1910. At the termination block 1910, the process 1900 ends. Alternatively, the process 1900 may be repeated periodically, in continuous fashion, or upon being triggered as a result of a condition.

FIG. 20 is a flow diagram illustrating an example process 2000 for forming a stretchable photovoltaic device under hybrid formation. For avoidance of repetition and for ease of simplicity, the following describes the process 2000 with reference to the architectures of the stretchable devices 200, 600, 700, 1000, 1500, 1700 and 1800 of FIGS. 2, 6, 7, 10A-10B, FIG. 15, FIG. 17 and FIG. 18, respectively. The process 2000 may be carried out using other architectures as well.

The flow 2000 starts at termination block 2002, and sometime thereafter, transitions to process block 2004. At the process block 2004, the process 2000 may form the stretchable carrier 1002. To do this, the process 2000 may form the stretchable parts 1006 and mounting sites 1008 similar to forming the stretchable carrier 102 as described above. For example, the process 2000 may deposit one or more metals and/or plastics over a given form so as to form a foil in the form the stretchable parts 1006 and mounting sites 1008.

The process 2000 may deposit the metals and/or plastics. The metals and plastics may include, for example, any of as stainless steel, aluminum and copper, polyimide, polyethylene, ethylene vinyl acetate (EVA), and the like. The foil, and in turn, the stretchable parts 1006 and mounting sites 1008 may have an ultimate thickness between about 10 to 200 microns or between about 25 to 100 microns. In addition, the process 2000 may machine or otherwise remove the apertures 1010 from the foil.

Alternatively, the process 2000 may form the stretchable parts 1006 separately from the mounting sites 1008, and then join the stretchable parts 1006 with the mounting sites 1008. For example, the process 2000 may form the stretchable parts 1006 from an from metal or plastic foils (or from an elastic material not having corrugations), and form the mounting sites 1008 from metal or plastic foils. Thereafter, the process 2000 may join or otherwise attach the foils together. In one particular embodiment, each of the mounting sites 1008 may have a surface area in a range of about 1 to 300 mm$^2$ or in a range of about 10 to 100 mm$^2$. And an overall area of the stretchable carrier 1002 may be in a range of about 0.1 to 2 m$^2$.

After process block 2004, the process 2000 may transition to process block 2006. At the process block 2006, the process 2000 may form the plurality of PV cells 1004. To form the plurality of PV cells 1004, the process 2006 may deposit or process semiconductor materials noted above to form respective PV stacks over respective substrates. To do this, the process 2006 may use any of PVD, CVD, ALD and the like to deposit the PV-stack layers of each of the respective PV stacks onto or over the plurality of substrates, which may be flexible or rigid. The process 2006 may do this in accordance with the example described above with respect to the PV stack 204. In addition, the PV cells may be crystalline or polycrystalline Si cells, GIGS cells on glass substrates, high-efficiency III-V multi-junction cells (e.g. GaAs-based cells), etc. After the process block 2006, the process 2000 may transition to process block 2008.

At the process block 2008, the process 2000 may combine the plurality of PV cells 1004 with the stretchable carrier 1002. The process 2000 may do so by mounting, affixing or otherwise attaching the each of the plurality of PV cells 1004 onto (or over) the mounting sites 1008. The process 2000 may use one or more bonding agents or adhesives to attach the plurality of PV cells 1004 to the mounting sites 1008. As an alternative, the process 2000 may attach pedestals or spacers to the mounting sites 1008, and then attach, respectively, the plurality of PV cells to the pedestals or spacers. After the process block 2008, the process 2000 may transition to process block 2010.

At the process block 2010, the process 2000 may interconnect the plurality of PV cells 1004 to the output terminals of the PV device 1000. To facilitate this, the process 200 may appropriately interconnect the first and second conductors of each of the plurality of PV cells to form a series or parallel interconnection. Then, the process 2000 may interconnect the interconnected PV cells to the output terminals 205, 207. To facilitate such interconnection, the process 2000 may deposit metals to form wires or alternatively wirebond wires or print conductive traces as described above with respect to the PV devices 1700, 1800 of FIGS. 17 and 18, respectively. Any combination of the foregoing is possible as well.

After process block 2010, the process 2000 may transition to termination block 2012. At the termination block 2012, the process 2000 ends. Alternatively, the process 2000 may be repeated periodically, in continuous fashion, or upon being triggered as a result of a condition.

CONCLUSION

Variations of the method, apparatus and system described above are possible without departing from the scope of the invention. In view of the wide variety of embodiments that can be applied, it should be understood that the illustrated embodiments. In addition, those skilled in the art will appreciate that the present invention has applicability in many arenas. For example, one or more embodiments of the present invention may be used in or form, at least a part of, a skin of automotive body or body panel, and be used to provide electrical energy to a battery or a motor. In addition, similar embodiments of the present invention may be used with other types of vehicles, such as planes, trains, trucks, ships, weather balloons, airships, satellites, space ships, orbital stations and others.

Furthermore, embodiments of the present invention may be used in many other applications, for example, providing extra electrical power in cars and other vehicles, recharging batteries in personal devices and appliances, providing independent power in monitoring and sensing equipment, etc. Some embodiments of the present invention may be used in wearable electronic devices that may be flexible and stretchable. In addition, embodiments of the present invention may also facilitate large volume production and widespread usage of photovoltaic devices.

The foregoing description of preferred embodiments of the present invention provides illustration and description, but is not intended to be exhaustive or to limit the invention to the precise form disclosed. Modifications and variations are possible in light of the above teachings or may be acquired from practice of the invention. For example, any of the stretchable substrate 102 (FIG. 1) and the stretchable parts of the stretchable carriers, stretchable devices and/or stretchable modules might not be or include corrugations. Instead, any of the stretchable substrate 102 and stretchable parts may be or include any of elastic or elastic-like devices, deformable and pliant springs, mechanical rails and others devices that are stretchable.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the terms "any of" followed by a listing of a plurality of items and/or a plurality of categories of items, as used herein, are intended to include "any of," "any combination of," "any multiple of," and/or "any combination of multiples of" the items and/or the categories of items, individually or in conjunction with other items and/or other categories of items.

Exemplary embodiments have been illustrated and described. Further, the claims should not be read as limited to the described order or elements unless stated to that effect. In addition, use of the term "means" in any claim is intended to invoke 35 U.S.C. § 112, ¶ 6, and any claim without the word "means" is not so intended.

What is claimed is:

1. A carrier comprising:
   a stretchable part having a stretchable-part length, wherein the stretchable-part length is operable to change a length dimension of the carrier in response to a force being applied to the carrier, wherein the stretchable part comprises a plurality of corrugations, and wherein the change in the stretchable-part length is produced by a change in an amplitude and width of at least some of the plurality of corrugations; and
   a mounting site having a flat foundation surface located between at least some of the plurality of corrugations on which to affix at least one photovoltaic cell;
   wherein the stretchable part comprises first and second stretchable parts having respective first and second stretchable part lengths, wherein the first stretchable part is oriented orthogonally to the second stretchable part, and wherein the first stretchable part length is operable to change independently from the second stretchable part length.

2. A stretchable photovoltaic device comprising:
   a stretchable part having a stretchable-part length, wherein the stretchable-part length is operable to change a length dimension of the stretchable photovoltaic device in response to a force being applied to the stretchable photovoltaic device, wherein the stretchable part comprises a plurality of corrugations, and wherein the change in the stretchable-part length is produced by a change in an amplitude and width of at least some of the plurality of corrugations;
   at least one photovoltaic cell; and
   a mounting site having a flat foundation surface located between at least some of the plurality of corrugations on which the at least one photovoltaic cell is disposed;
   wherein the stretchable part comprises first and second stretchable parts having respective first and second stretchable-part lengths, wherein the first stretchable part is oriented orthogonally to the second stretchable part, and wherein the first stretchable-part length is operable to change independently from the second stretchable-part length.

* * * * *